(12) United States Patent
Kim et al.

(10) Patent No.: US 9,652,578 B2
(45) Date of Patent: May 16, 2017

(54) LAYOUT DESIGN METHODS AND LAYOUT DESIGN SYSTEMS FOR PERFORMING THE LAYOUT DESIGN METHODS

(71) Applicant: Samsung Electronics Co., Ltd., Suwon-si, Gyeonggi-do (KR)

(72) Inventors: Dong-Gyun Kim, Seoul (KR); Sung-Wook Hwang, Chilgok-gun (KR); Dae-Kwon Kang, Yongin-si (KR); Jae-Seok Yang, Hwaseong-si (KR); Ji-Young Jung, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 255 days.

(21) Appl. No.: 14/674,416

(22) Filed: Mar. 31, 2015

(65) Prior Publication Data
US 2016/0026744 A1    Jan. 28, 2016

(30) Foreign Application Priority Data

Jul. 28, 2014  (KR) ........................ 10-2014-0095836

(51) Int. Cl.
*G06F 17/50*  (2006.01)
*H01L 27/02*  (2006.01)
*H01L 21/308*  (2006.01)

(52) U.S. Cl.
CPC ...... *G06F 17/5081* (2013.01); *G06F 17/5063* (2013.01); *G06F 17/5068* (2013.01); *H01L 27/0207* (2013.01); *H01L 21/3086* (2013.01)

(58) Field of Classification Search
None
See application file for complete search history.

(56) References Cited

U.S. PATENT DOCUMENTS

| | | |
|---|---|---|
| 6,539,528 B2 | 3/2003 | Hwang et al. |
| 6,662,350 B2 | 12/2003 | Fried et al. |
| 7,315,994 B2 | 1/2008 | Aller et al. |
| 7,539,970 B2 | 5/2009 | Jung et al. |
| 8,250,496 B2 | 8/2012 | Moon |
| 8,621,398 B2 | 12/2013 | Shen et al. |
| 8,631,382 B2 | 1/2014 | Wang et al. |
| 8,881,066 B2 * | 11/2014 | Shieh .............. H01L 21/823431 716/51 |
| 8,932,957 B2 * | 1/2015 | Shieh .............. H01L 21/823431 438/700 |

(Continued)

*Primary Examiner* — Leigh Garbowski
(74) *Attorney, Agent, or Firm* — Myers Bigel, P.A.

(57) ABSTRACT

A layout design method may include receiving predetermined values related to first to third normal fin designs extending in a first direction and arranged in parallel in a second direction perpendicular to the first direction, generating dummy fin designs based on the predetermined values, generating mandrel candidate designs based on the first to third normal fin designs and the dummy fin designs, decomposing the mandrel candidate designs to first and second mandrel mask designs, and generating a final mandrel mask design using one of the first and second mandrel mask designs that satisfies a predetermined condition. A first interval distance in the second direction between the first normal fin design and the second normal fin design may be different from a second interval distance in the second direction between the second normal fin design and the third normal fin design.

20 Claims, 23 Drawing Sheets

(56) References Cited

U.S. PATENT DOCUMENTS

| | | | |
|---|---|---|---|
| 9,190,498 B2 * | 11/2015 | Brand | H01L 29/66803 |
| 9,324,570 B1 * | 4/2016 | Liou | H01L 21/0337 |
| 2013/0174103 A1 | 7/2013 | Shieh et al. | |
| 2014/0080276 A1 | 3/2014 | Brand et al. | |

* cited by examiner

FIG. 14
MM1
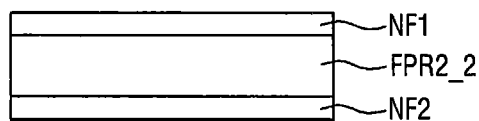
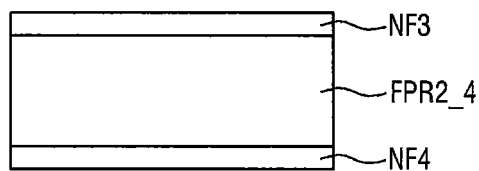
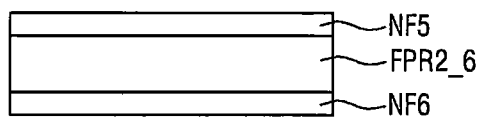
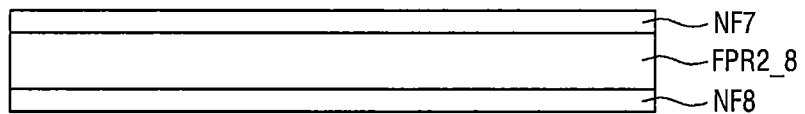
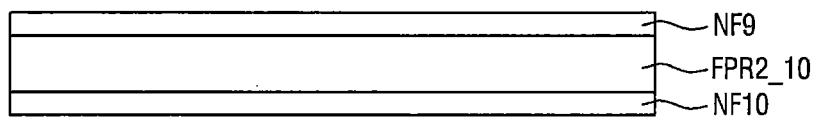
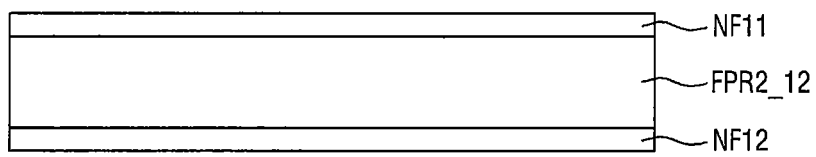

FIG. 15
MM2
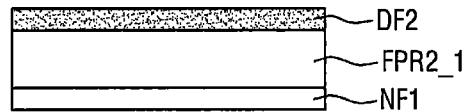
DF2
FPR2_1
NF1
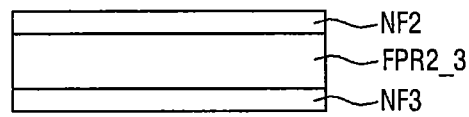
NF2
FPR2_3
NF3
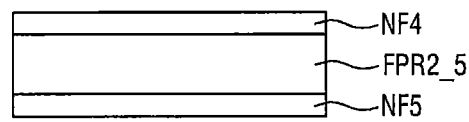
NF4
FPR2_5
NF5
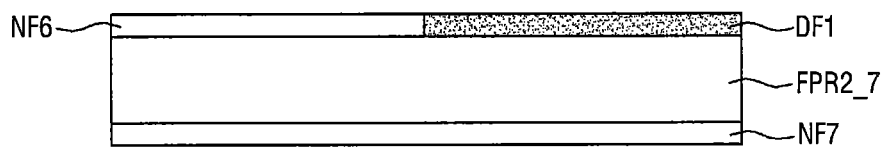
NF6
DF1
FPR2_7
NF7
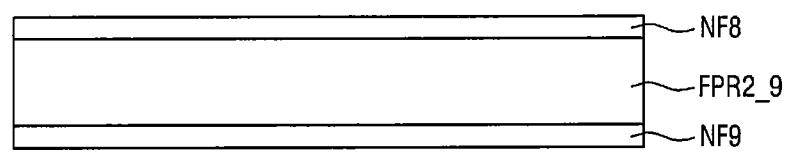
NF8
FPR2_9
NF9
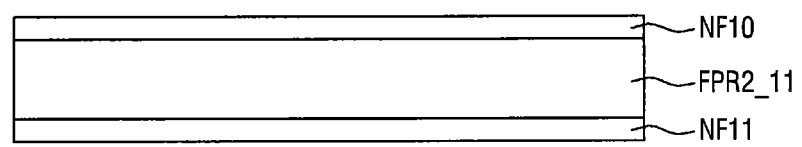
NF10
FPR2_11
NF11
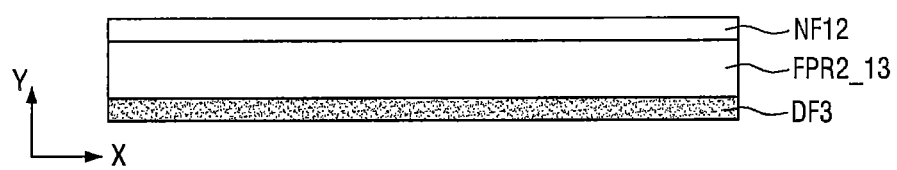
NF12
FPR2_13
DF3
Y
X

FIG. 19
MM1-XOR
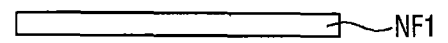  NF1
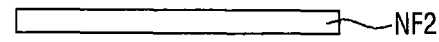  NF2
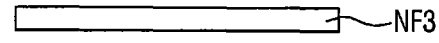  NF3
  NF4
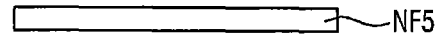  NF5
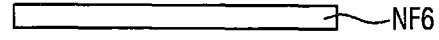  NF6
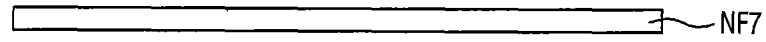  NF7
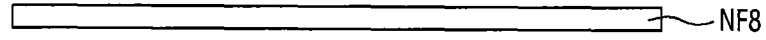  NF8
  NF9
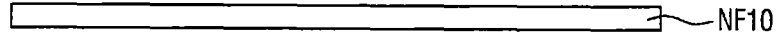  NF10
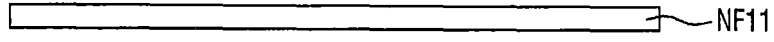  NF11
  NF12
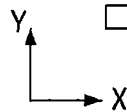

LAYOUT DESIGN METHODS AND LAYOUT DESIGN SYSTEMS FOR PERFORMING THE LAYOUT DESIGN METHODS

CROSS-REFERENCE TO RELATED APPLICATION

This application claims priority under 35 U.S.C. §119 to Korean Patent Application No. 10-2014-0095836, filed on Jul. 28, 2014 in the Korean Intellectual Property Office, the disclosure of which is incorporated herein in its entirety by reference.

FIELD

Some embodiments relate to a layout design method and a layout design system for performing the layout design method.

BACKGROUND

As a semiconductor device fabricating process is gradually miniaturized, there may be an increase in demand for a small-size semiconductor device. In order to fabricate such a small-size semiconductor device, a layout may be designed that can achieve scale reduction and reliability of a standard cell.

SUMMARY

According to some embodiments of the inventive concepts, a layout design method may include: receiving predetermined values related to first to third normal fin designs extending in a first direction and arranged in parallel in a second direction perpendicular to the first direction; generating dummy fin designs based on the predetermined values; generating mandrel candidate designs based on the first to third normal fin designs and the dummy fin designs; decomposing the mandrel candidate designs to first and second mandrel mask designs; and generating a final mandrel mask design using one of the first and second mandrel mask designs that satisfies a predetermined condition. A first interval distance in the second direction between the first normal fin design and second normal fin design may be different from a second interval distance in the second direction between the second normal fin design and the third normal fin design.

In some embodiments, the predetermined values related to the first to third normal fin designs may include values that define widths of the first to third normal fin designs in the second direction and intervals between the first to third normal fin designs in the second direction.

In some embodiments, generating the dummy fin designs based on the predetermined values may include: generating first fin interval region designs that define the intervals between the first to third normal fin designs in the second direction based on the predetermined values; generating dummy region designs on side surfaces of the first to third normal fin designs; and generating the dummy fin designs based on the dummy region designs.

In some embodiments, widths of the dummy region designs in the second direction may be smaller than widths of the first to third normal fin designs in the second direction and the intervals between the first to third normal fin designs in the second direction.

In some embodiments, generating the dummy fin designs based on the dummy region designs may include: selecting ones of the dummy region designs that overlap the first fin interval region designs; generating a rectangular region design based on the selected ones of the dummy region designs; defining a mandrel region design in a portion of the rectangular region design that is free of the first fin interval region designs; and generating a dummy fin design on a side surface of the mandrel region design that is not in contact with the dummy region designs.

In some embodiments, the rectangular region design may be generated between adjacent first and second ones of the dummy region designs. The first one of the dummy region designs may have a longer length in the first direction than a length in the first direction of the second one of the dummy region designs. The first one of the dummy region designs may define one side of the rectangular region design.

In some embodiments, generating the dummy fin designs based on the dummy region designs may include: selecting ones of the dummy region designs that do not overlap the first fin interval region designs; defining respective mandrel region designs corresponding to the selected ones of the dummy region designs; and generating the dummy fin designs on outer side surfaces of the mandrel region designs corresponding to the selected ones of the dummy region designs. Ones of the mandrel region designs may have a side surface defined by a corresponding one of the selected dummy region designs. The outer side surfaces of the mandrel region designs may be opposite the dummy region designs.

In some embodiments, ones of a subset of the first to third normal fin designs may have a different length in the first direction than lengths in the first direction of ones of a remaining subset of the first to third normal fin designs.

In some embodiments, widths of the first to third normal fin designs in the second direction may be equal to each other.

In some embodiments, generating the mandrel candidate designs may include: generating second fin interval region designs defining respective intervals between ones of the dummy fin designs and adjacent ones of the first to third normal fin designs in the second direction and intervals between adjacent ones of the first to third normal fin designs in the second direction.

In some embodiments, a part of the second fin interval region design may be decomposed to the first mandrel mask design, and the remainder thereof may be decomposed to the second mandrel mask design.

In some embodiments, decomposing the mandrel candidate designs to first and second mandrel mask designs may include generating the first mandrel mask design to include a subset of the second fin interval region designs, and generating the second mandrel mask design to include a remaining subset of the second fin interval region designs.

In some embodiments, generating the final mandrel mask design using the one of the first and second mandrel mask designs that satisfies the predetermined condition may include: generating a normal fin enclosure design based on the first to third normal fin designs; generating first and second mandrel mask enclosure designs based on the first and second mandrel mask designs; selecting one of the first and second mandrel mask designs that satisfies the predetermined condition through comparison of the first and second mandrel mask enclosure designs with the normal fin enclosure design; and generating the final mandrel mask design using the selected one of the first and second mandrel mask designs.

In some embodiments, comparison of the first and second mandrel mask enclosure designs with the normal fin enclosure design may be performed through an XOR operation.

In some embodiments, the layout design method may further include checking whether misalignment occurs between the final mandrel mask design and ones of the first to third normal fin designs or between the final mandrel mask design and ones of the dummy fin designs.

In some embodiments, the final mandrel mask design may include a plurality of final mandrel designs, and ones of a subset of the plurality of final mandrel designs may have a different width in the second direction than widths in the second direction of ones of a remaining subset of the plurality of final mandrel designs.

According to some embodiments, a layout design method may include receiving first to third normal fin designs extending in a first direction, arranged in parallel in a second direction that crosses the first direction, and spaced apart from each other at different intervals in the second direction; generating dummy fin designs based on the first to third normal fin designs; and generating first and second mandrel designs having different widths in the second direction based on the first to third normal fin designs and the dummy fin designs. A part of the first to third normal fin designs may have different lengths in the first direction, and the remainder thereof may have the same length in the first direction. The widths of the first and second mandrel designs in the second direction may be equal to intervals between the dummy fin designs and ones of the first to third normal fin designs in the second direction or intervals between the first to third normal fins in the second direction.

According to some embodiments, a layout design system may include a processor and a memory coupled to the processor and comprising computer readable code embodied in the memory. The computer readable code, when executed by the processor, may cause the processor to perform operations which may include: receiving predetermined values related to normal fin designs; generating dummy fin designs based on the predetermined values; generating mandrel candidate designs based on the normal fin designs and the dummy fin designs; decomposing the mandrel candidate designs to first and second mandrel mask designs; and generating a final mandrel design using one of the first and second mandrel mask designs that satisfies a predetermined condition.

In some embodiments, the operations may also include checking whether misalignment occurs between the final mandrel design and the normal fin designs or between the final mandrel design and the dummy fin designs using the processor.

According to some embodiments, a layout design method of generating a final mandrel mask may include providing a normal fin design including dimensional values which may define at least three normal fin regions extending parallel to each other in a first direction and separated from each other in a second direction perpendicular to the first direction. The layout design method may include generating an inner dummy fin region extending from a first normal fin region including a first length. The inner dummy fin region may extend to a second length of a second normal fin region adjacent the first normal fin region. The second length may be longer than the first length. The layout design method may include generating outer mandrel region designs extending in the first direction on outer edges of outer ones of the normal fin regions. The layout design method may include generating outer dummy fin regions extending in the first direction along outer edges of the outer mandrel region designs. The layout design method may include generating a plurality of candidate mandrel regions extending in the first direction between the normal and dummy fin regions. The layout design method may include generating first and second candidate mandrel mask designs including respective alternating ones of the plurality of the candidate mandrel regions and including the normal fin regions and/or dummy fin regions contacting the respective alternating ones of the plurality of the candidate mandrel regions. The layout design method may include selecting one of the first and second candidate mandrel mask designs. The layout design method may include generating the final mandrel mask including the mandrel regions of the selected one of the first and second candidate mandrel mask designs.

In some embodiments, the layout design method may include generating a final fin design including the normal fin regions and the dummy fin regions of the selected one of the first and second candidate mandrel mask designs and checking for misalignment between the final mandrel mask and the final fin design.

In some embodiments, selecting one of the first and second candidate mandrel mask designs may include: comparing the first and second candidate mandrel mask designs to the normal fin design; determining that a match of the first candidate mandrel mask design to the normal fin design is closer than a match of the second candidate mandrel mask design to the normal fin design based on the comparing the first and second candidate mandrel mask designs to the normal fin design; and selecting the first candidate mandrel mask design based on the determining that the match of the first candidate mandrel mask design to the normal fin design is closer than the match of the second candidate mandrel mask design to the normal fin design.

In some embodiments, comparing the first and second candidate mandrel mask designs to the normal fin design may include performing a first XOR operation between the first candidate mandrel mask design and the normal fin design and a second XOR operation between the second candidate mandrel mask design and the normal fin design.

In some embodiments, selecting between the first and second candidate mandrel mask designs may include: determining that the first candidate mandrel mask design includes fewer dummy gate regions than the second candidate mandrel mask design; and selecting the first candidate mandrel mask design based on the determining that the first candidate mandrel mask design comprises fewer dummy gate regions than the second candidate mandrel mask design.

BRIEF DESCRIPTION OF THE DRAWINGS

The accompanying figures are included to provide a further understanding of present inventive concepts, and are incorporated in and constitute a part of this specification. The drawings illustrate some embodiments of present inventive concepts and, together with the description, serve to explain principles of present inventive concepts.

FIGS. 2 to 21 are plan views schematically illustrating designs according to the layout design methods of FIG. 1, according to some embodiments of the present inventive concepts;

DETAILED DESCRIPTION OF THE EMBODIMENTS

Figure 1:
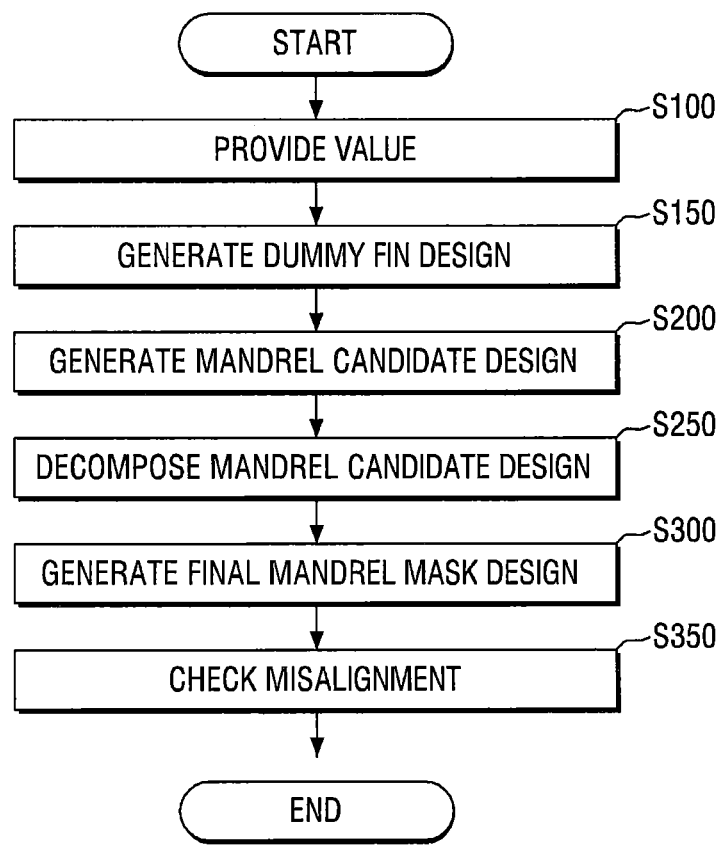
FIG. 1 is a flowchart illustrating layout design methods according to some embodiments of the present inventive concepts.

Embodiments are described in detail with reference to the accompanying drawings in which some embodiments are shown. The present inventive concepts may, however, be embodied in many different forms and should not be construed as being limited to the embodiments set forth herein. Rather, these embodiments are provided so that this disclosure will be thorough and complete and will fully convey the concepts of the inventive concepts to those skilled in the art. Unless otherwise noted, like reference numerals refer to like elements throughout the attached drawings and written description, and thus descriptions may not be repeated.

The terminology used herein is for the purpose of describing particular embodiments only and is not intended to be limiting of the inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concepts.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but may include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Unless otherwise defined, all terms (including technical and scientific terms) used herein have the same meaning as commonly understood by one of ordinary skill in the art to which the present inventive concepts belong. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, a layout design method according to some embodiments of the present inventive concepts will be described with reference to FIGS. 1 to 21.

FIG. 1 is a flowchart illustrating layout design methods according to some embodiments of the present inventive concepts, and FIGS. 2 to 21 are plan views illustrating designs according to the layout design methods of FIG. 1, according to some embodiments of the present inventive concepts.

Figure 2:
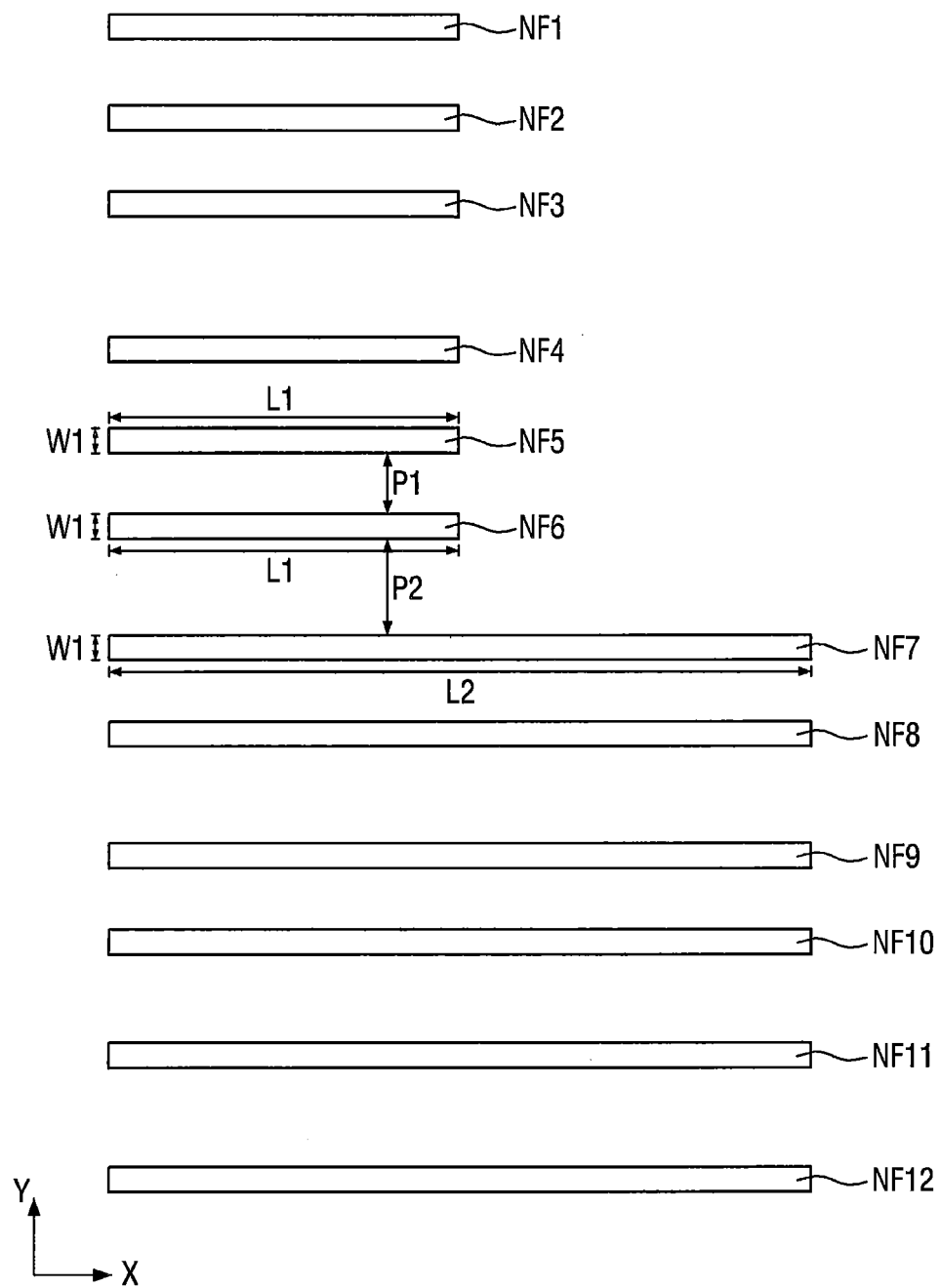

First, referring to FIGS. 1 and 2, predetermined values may be provided (S100).

Specifically, the predetermined values related to a plurality of normal fin designs NF1 to NF12, which may extend in a first direction X and may be arranged in parallel to a second direction Y perpendicular to or that otherwise crosses the first direction X, may be provided.

Here, the predetermined values related to the plurality of normal fin designs NF1 to NF12 may include values that define widths of the plurality of normal fin designs NF1 to NF12 in the second direction Y and intervals between the plurality of normal fin designs NF1 to NF12 in the second direction Y.

Further, the plurality of normal fin designs NF1 to NF12 may be generated on the basis of the predetermined values related to the plurality of normal fin designs NF1 to NF12.

Here, the widths of the plurality of normal fin designs NF1 to NF12 in the second direction Y may be equal to each other. However, some of the plurality of normal fin designs NF1 to NF12 may have the same length in the first direction X, and the remainder thereof may have different lengths in the first direction X. Further, some of the plurality of normal fin designs NF1 to NF12 may have the same interval between them in the second direction Y, and the remainder thereof may have different intervals between them in the second direction Y.

Specifically, for example, the lengths of the fifth and sixth normal fin designs NF5 and NF6 in the first direction X may be equal to each other, i.e., a first length L1, and the length of the seventh normal fin design NF7 in the first direction X may be a second length L2 that is different from the first length L1. Further, the interval between the fifth and sixth normal fin designs NF5 and NF6 in the second direction may be a first interval P1, and the interval between the sixth and seventh normal fin designs NF6 and NF7 in the second direction Y may be a second interval P2 that is different from the first interval P1. The widths of the fifth to seventh normal fin designs NF5 to NF7 in the second direction Y may be equal to each other, i.e., a first width W1.

Next, referring to FIGS. 1 and 3 to 12, dummy fin designs may be generated (S150).

Specifically, the dummy fin design may include an inner dummy fin design and an outer dummy fin design. First, a process of generating the inner dummy fin design will be described with reference to FIGS. 3 to 8.

Figure 3:
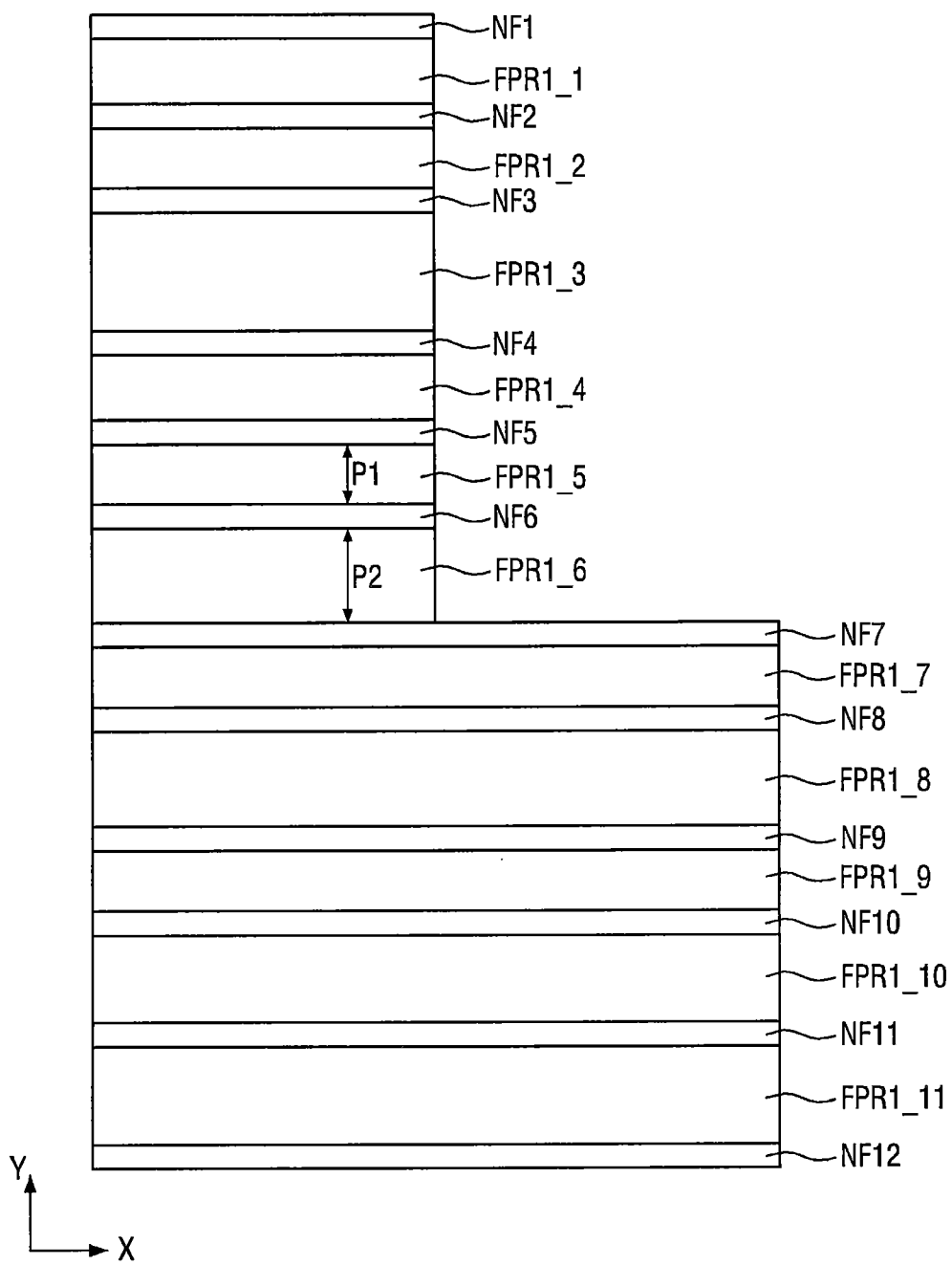

Referring to FIG. 3, first fin interval region designs FPR1_1 to FPR1_11 that may define the intervals between the plurality of normal fin designs NF1 to NF12 arranged in parallel in the second direction Y may be generated on the basis of the predetermined values related to the plurality of normal fin designs NF1 to NF12.

The plurality of first fin interval region designs FPR1_1 to FPR1_11 may be provided so that the respective first fin interval region designs FPR1_1 to FPR1_11 can define intervals between the plurality of normal fin designs NF1 to NF12 in the second direction Y. Specifically, for example, the interval between the fifth and sixth normal fin designs NF5 and NF6 in the second direction Y may become the first interval P1, and the first interval P1 may be equal to the width of the first fin interval region design (e.g., FPR1_5) in the second direction Y. Further, the interval between the sixth and seventh normal fin designs NF6 and NF7 in the second direction Y may become the second interval P2, and the second interval P2 may be equal to the width of the first fin interval region design (e.g., FPR1_6) in the second direction Y.

Figure 4:
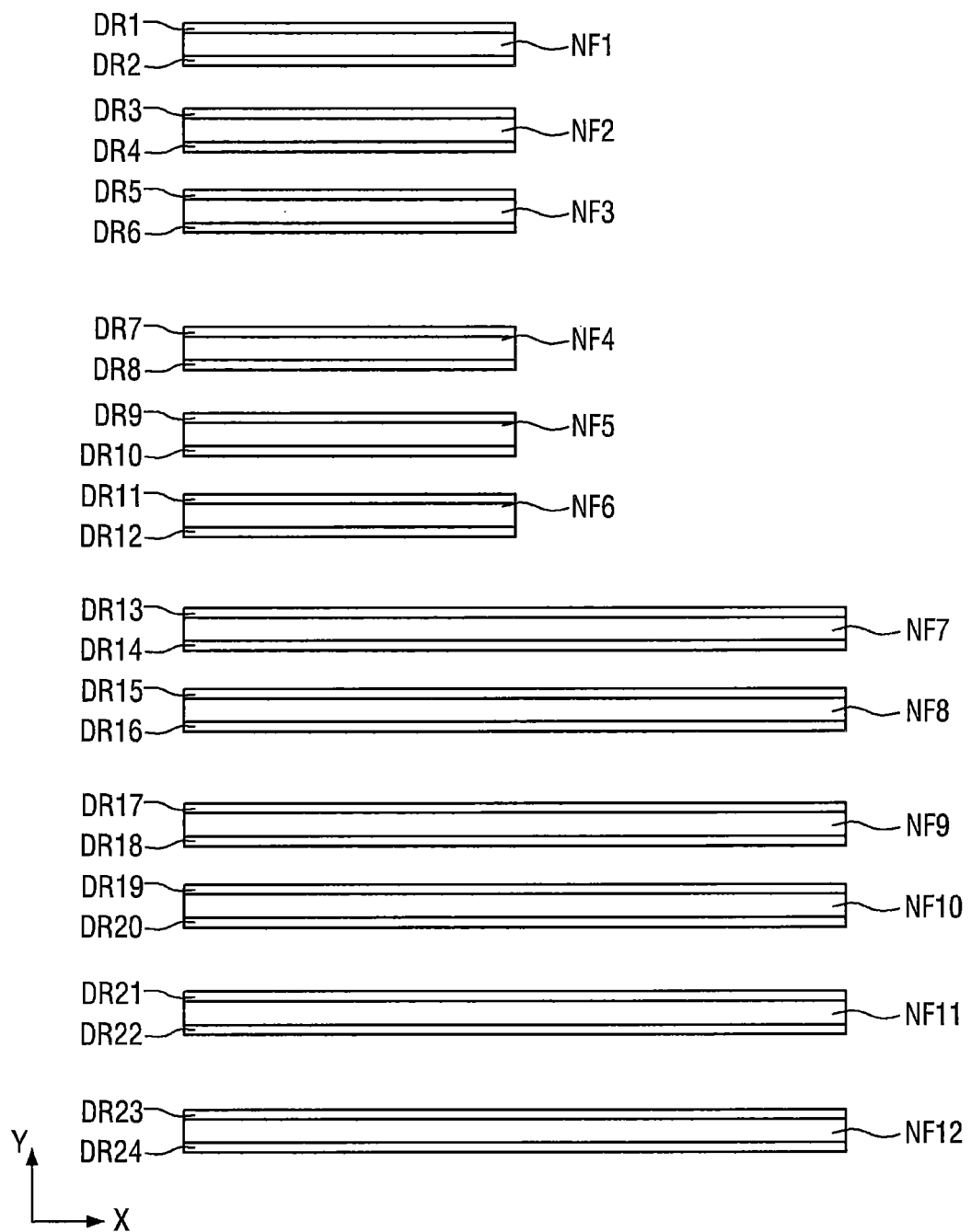

Next, referring to FIG. 4, dummy region designs DR1 to DR24 may be generated on side surfaces of the plurality of normal fin designs NF1 to NF12.

The plurality of dummy region designs DR1 to DR24 may be provided so that the widths of the dummy region designs DR1 to DR24 in the second direction Y may be smaller than the widths of the plurality of normal fin designs NF1 to NF12 in the second direction Y and the intervals between the plurality of normal fin designs NF1 to NF12 in the second direction Y.

Figure 5:
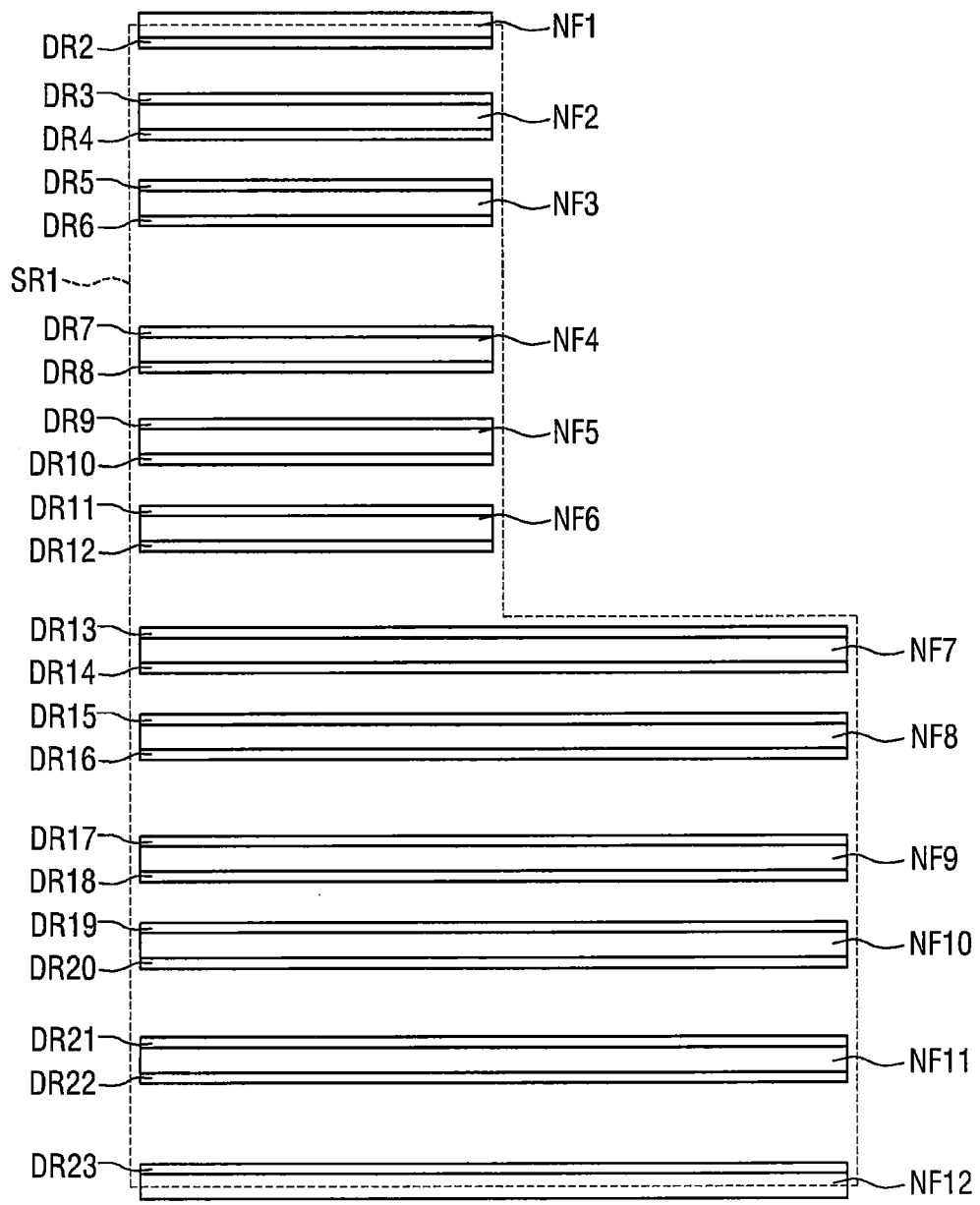

Referring to FIG. 5, among the dummy region designs DR1 to DR24, the dummy region designs that overlap the first fin interval region designs FPR1_1 to FPR1_11 may be selected.

Specifically, for example, if the second dummy region designs DR2 to the $23^{rd}$ dummy region design DR23, among the plurality of dummy region designs DR1 to DR24, overlap the first fin interval region designs FPR1_1 to FPR1_11, the second dummy region designs DR2 to the $23^{rd}$ dummy region design DR23 may be selected. That is, the selected second to $23^{rd}$ dummy region designs DR2 to DR23 may be included in a first selection region SR1.

Figure 6:
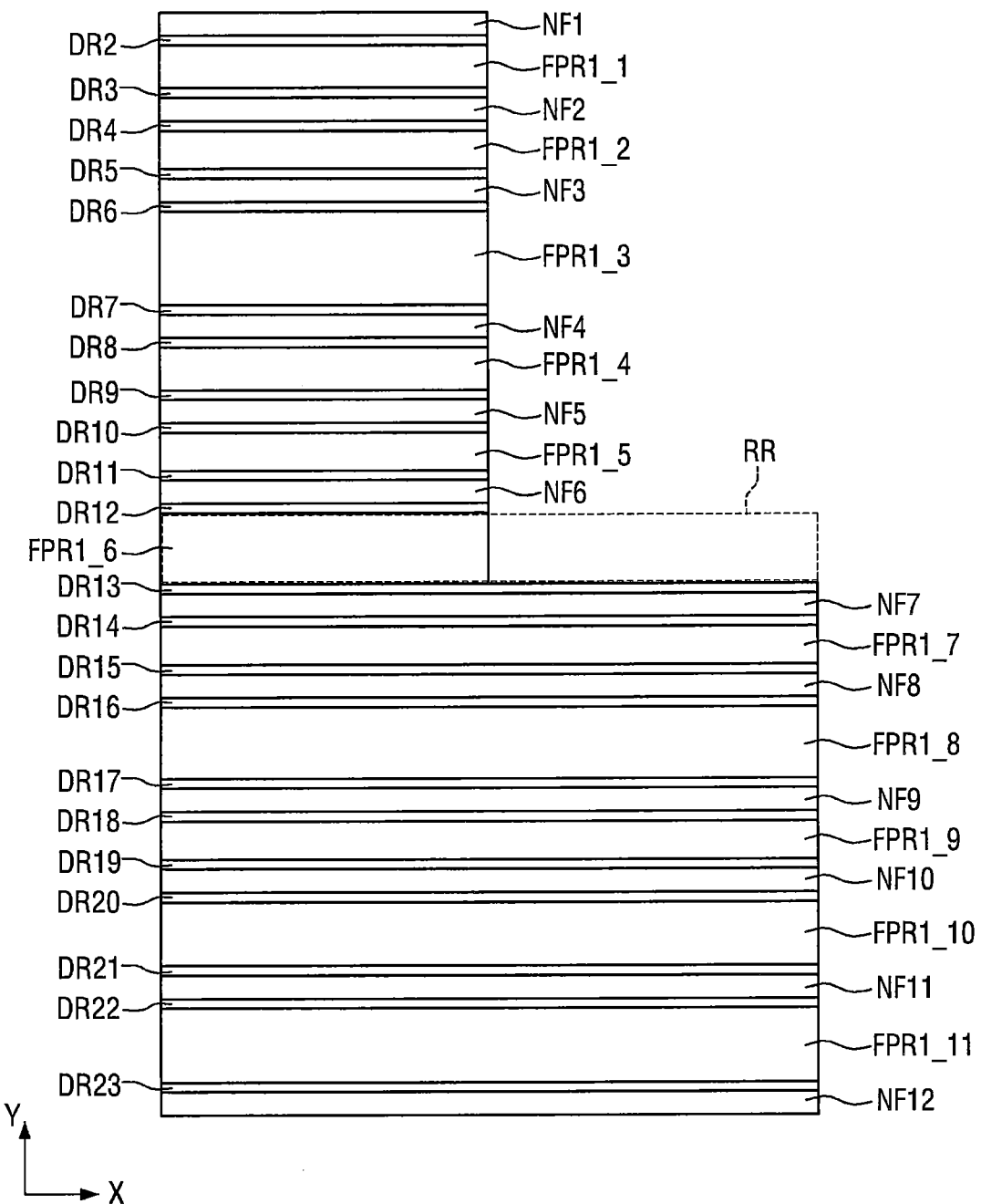

Referring to FIG. 6, after defining the first selection region SR1 to include the selected dummy region designs DR2 to DR23 and the first fin interval region designs FPR1_1 to FPR1_11, a rectangular region design RR may be generated.

Specifically, the rectangular region design RR may be generated corresponding to adjacent dummy region designs having different lengths (e.g., the $12^{th}$ and $13^{th}$ dummy region designs DR12 and DR13) among the second to 23th dummy region designs DR2 to DR23. The dummy region with the longer length (e.g., the $13^{th}$ dummy region design DR13) may define one side of the rectangular region design RR.

Referring to FIG. 6, since the $13^{th}$ dummy region design DR13, which may be opposite to the $12^{th}$ dummy region design DR12, has a different length in the first direction X, the rectangular region design RR may be generated with the length of the $13^{th}$ dummy region design DR13 in the first direction X as its one side.

Figure 7:
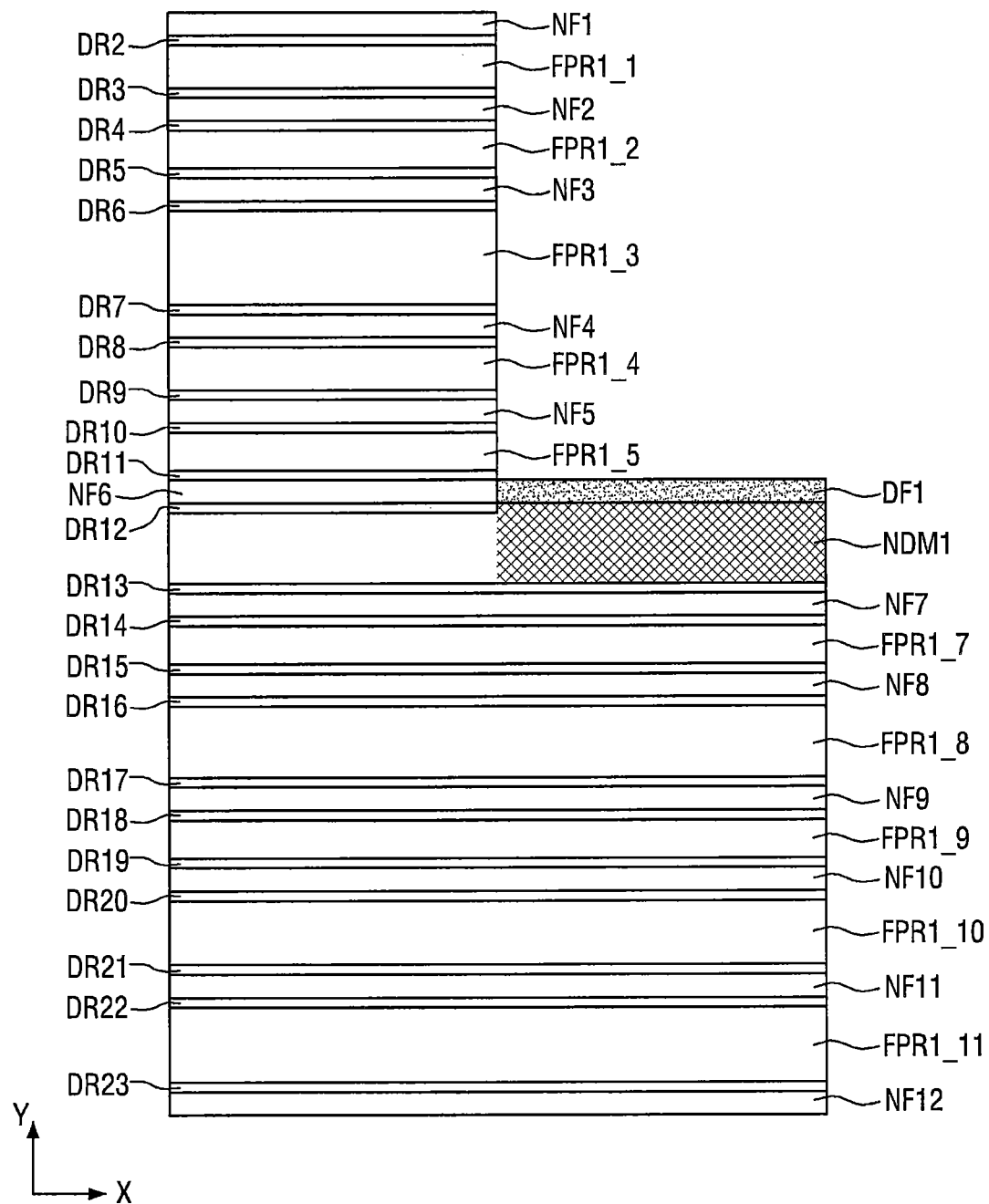

Next, referring to FIG. 7, a first mandrel region design NDM1 may be defined in an empty space of the generated rectangular region design RR.

Specifically, a part of the rectangular region design RR may be partially filled with the first fin interval region design (e.g., FPR1_6), and the remainder thereof may be an empty space. Accordingly, the first mandrel region design NDM1 may be generated in the remaining empty space. Further, a first dummy fin design DF1 may be generated on a side surface of the first mandrel region design NDM1, which is not in contact with the dummy region design (e.g., the $13^{th}$ dummy region design DR13).

Figure 8:
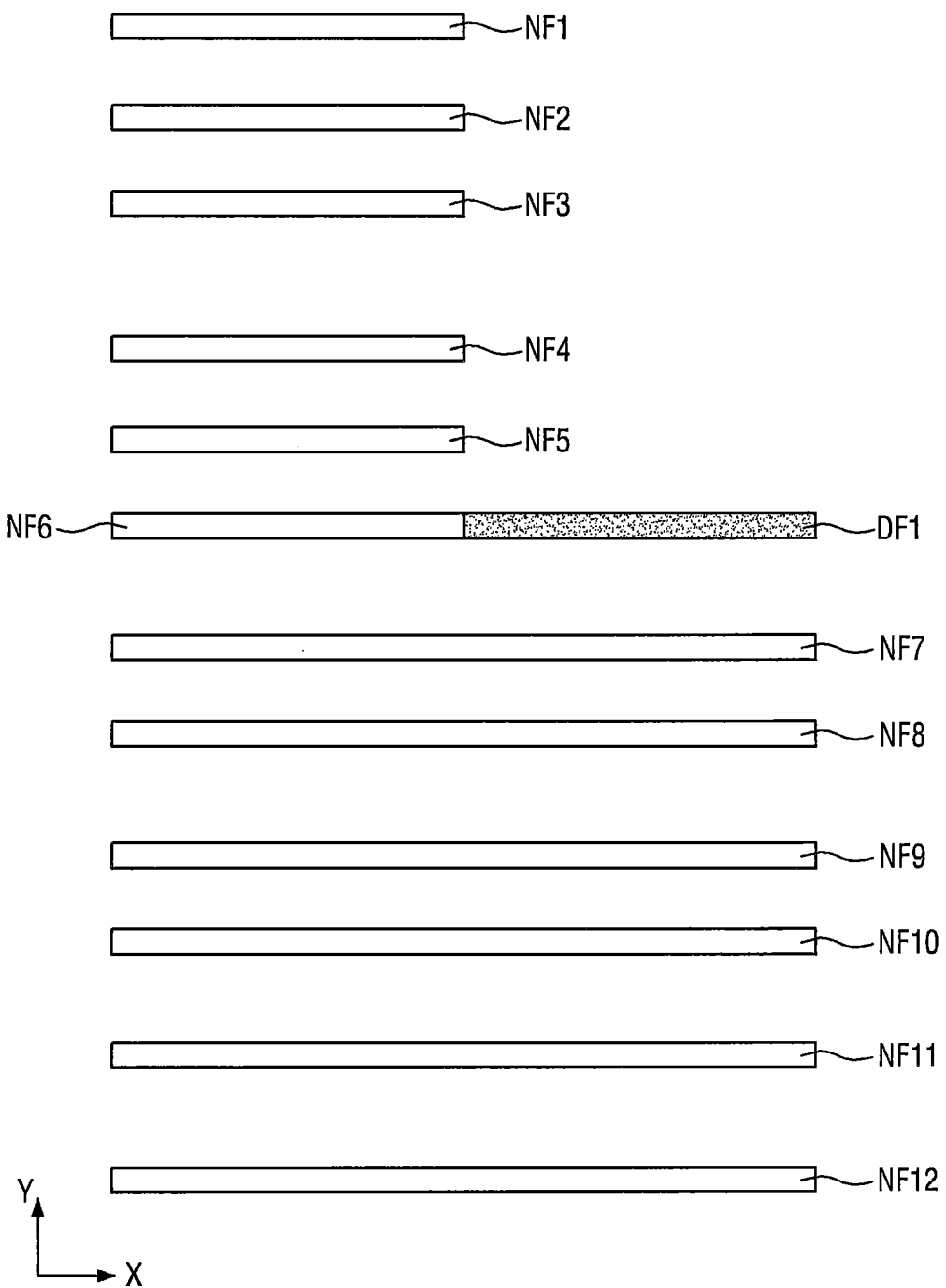

Referring to FIG. 8, a newly generated first dummy fin design DF1 is illustrated. Such a first dummy fin design DF1 may correspond to the inner dummy fin design. Specifically, the first dummy fin design DF1 may include the normal fin designs, NF1 to NF12, and the newly generated dummy fin design, DF1.

Next, a process of generating the outer dummy fin design will be described with reference to FIGS. 9 to 12. Since the process of generating the outer dummy fin design may include the processes illustrated in FIGS. 2 to 4, the explanation thereof will be omitted.

Figure 9:
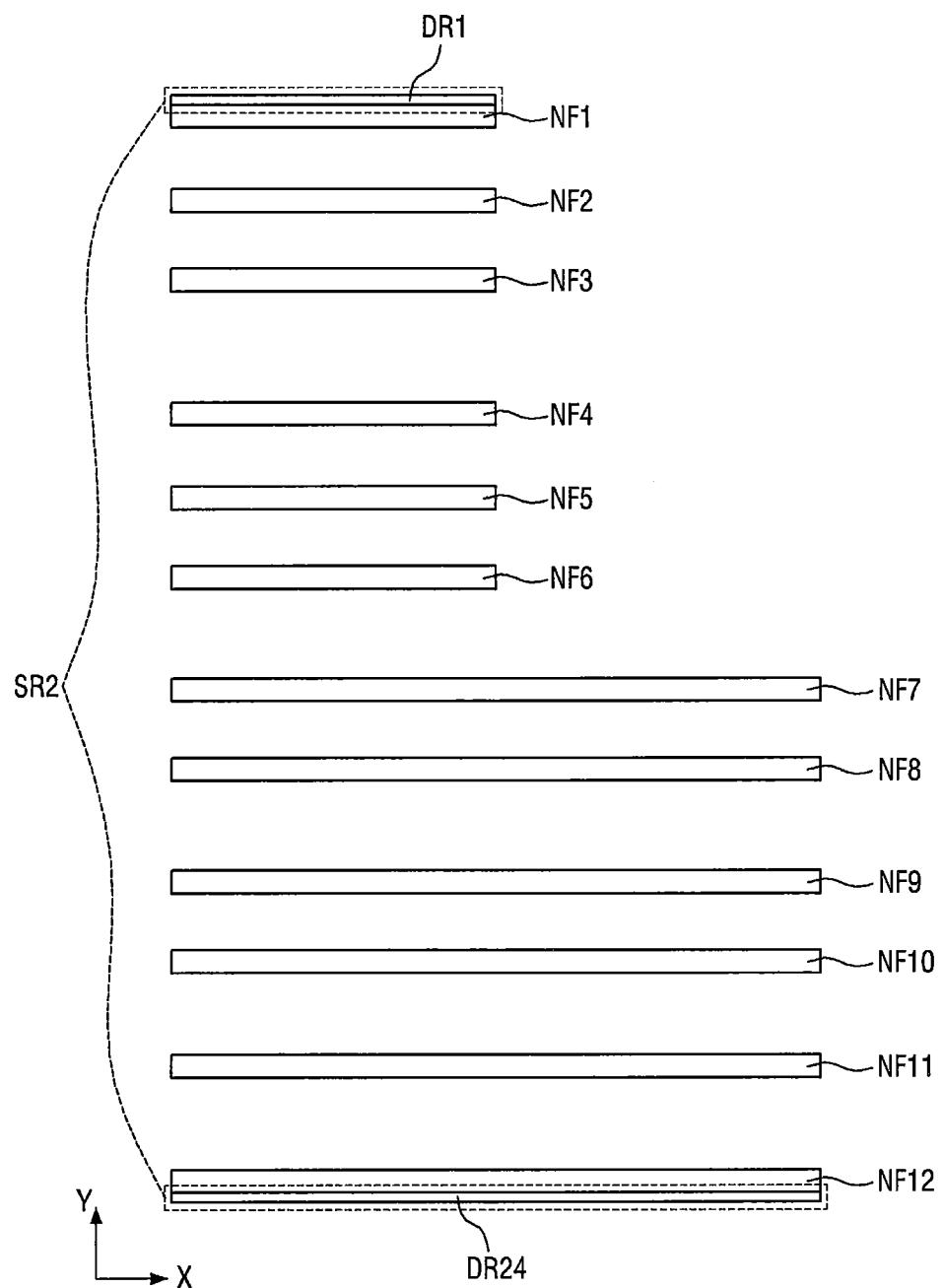

Referring to FIG. 9, the outer dummy fin design, unlike FIG. 5, may select the dummy region designs which do not overlap the first fin interval region designs FPR1_1 to FPR1_11 among the dummy region designs DR1 to DR24.

Specifically, for example, the first and $24^{th}$ dummy region designs DR1 and DR24 among the plurality of dummy region designs DR1 to DR24 may not overlap the first fin interval region designs FPR1_1 to FPR1_11, and thus the first and $24^{th}$ dummy region designs DR1 and DR24 may be selected. That is, the selected first and $24^{th}$ dummy region designs DR1 and DR24 may be included in a second selection region SR2.

Figure 10:
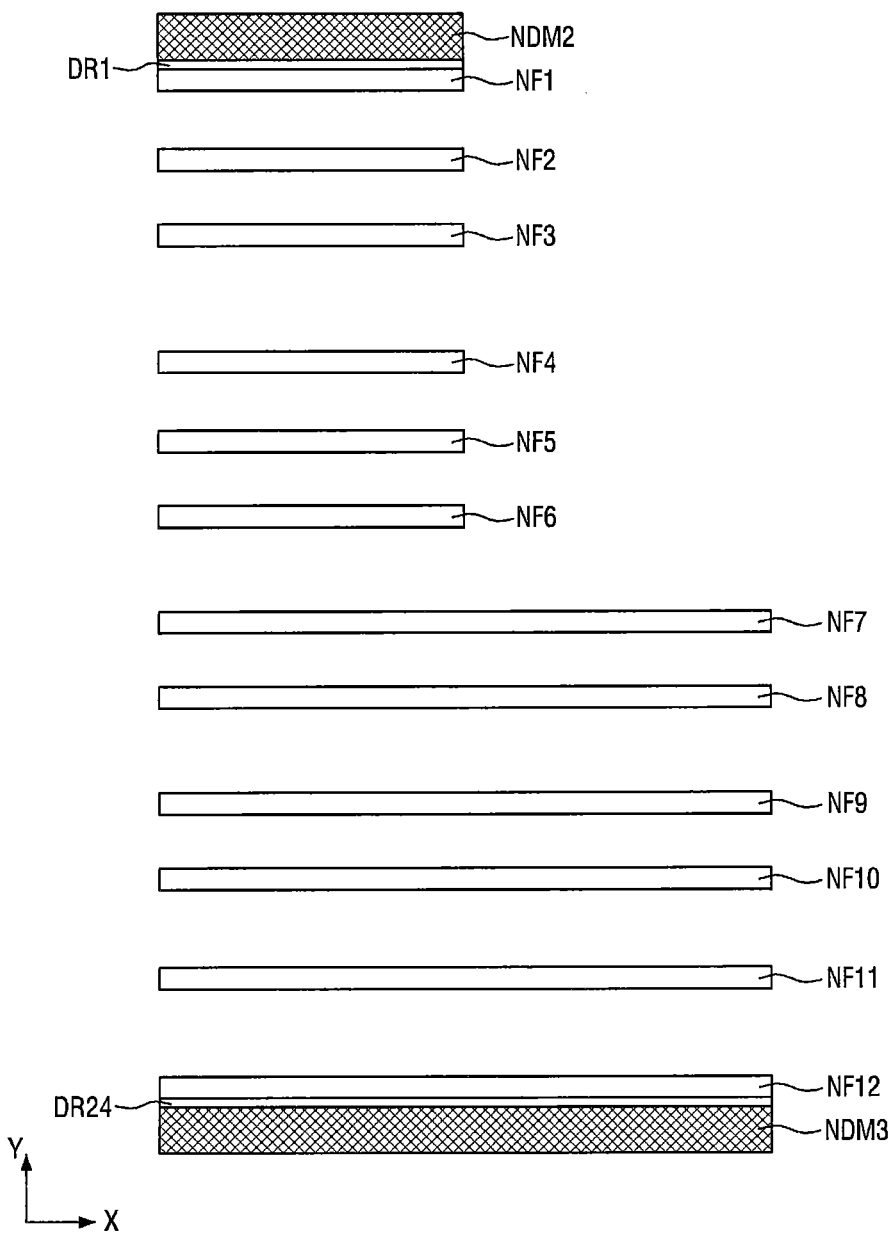

Referring to FIG. 10, a mandrel region design may be defined corresponding to each of the selected dummy region designs, having the respective selected dummy region design as one side surface thereof.

Specifically, for example, the second and third mandrel region designs NDM2 and NDM3 may be generated having a side surface of the respective selected dummy region design, i.e., the first and $24^{th}$ dummy region designs DR1 and DR24, that is not in contact with the normal fin designs (e.g., the first and $12^{th}$ normal fin designs NF1 and NF12), defining one side surface thereof.

Figure 11:
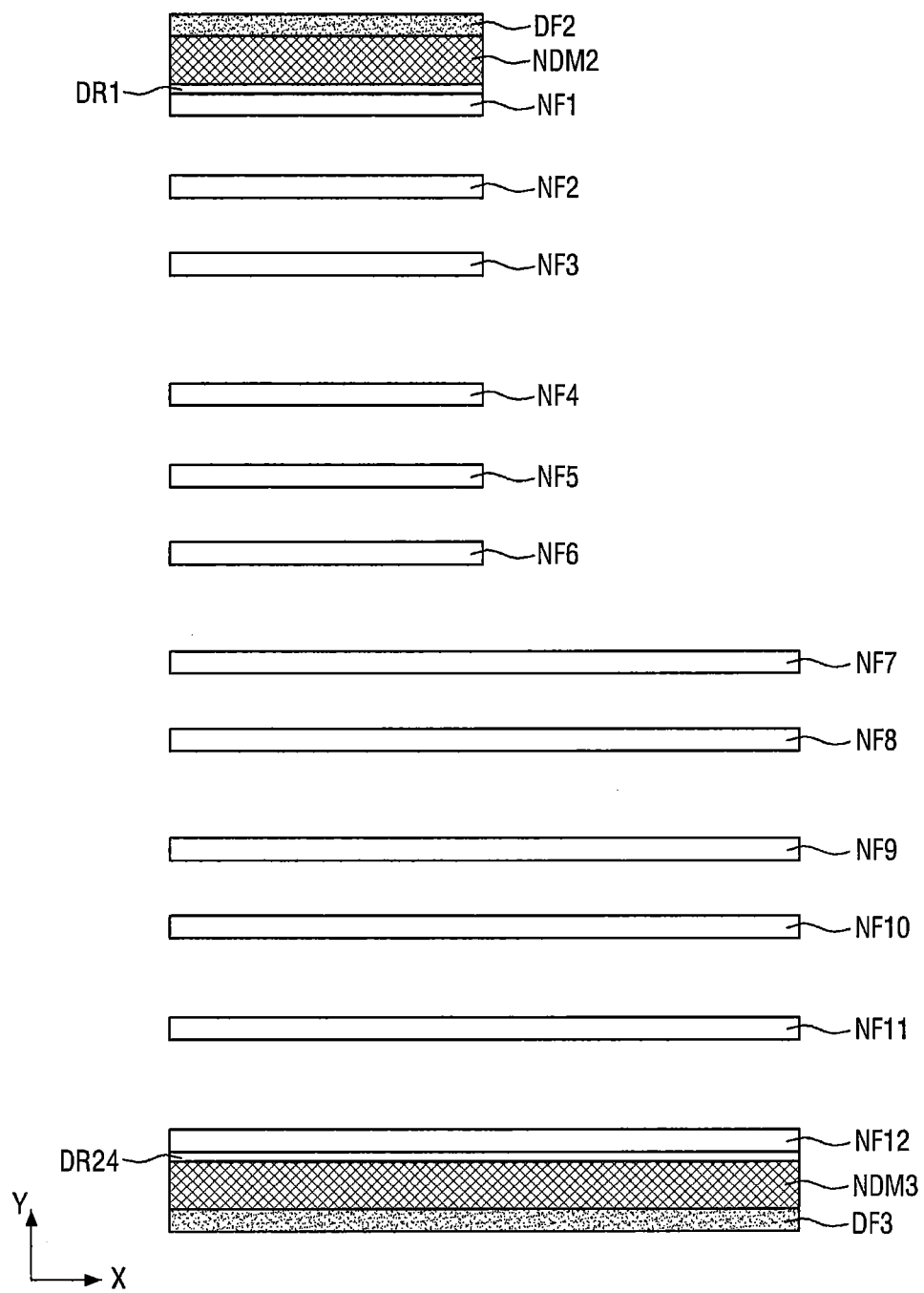

Next, referring to FIG. 11, dummy fin designs may be generated on respective side surfaces of the mandrel region designs, which are not in contact with the selected first and $24^{th}$ dummy region designs, DR1 and DR24.

Specifically, a second dummy fin design DF2 may be generated on a side surface of the second mandrel region design NDM2, which is not in contact with the first dummy region design DR1, and a third dummy fin design DF3 may be generated on a side surface of the third mandrel region design NDM3, which is not in contact with the 24$^{th}$ dummy region design DR24.

Further, the second and third dummy fin designs DF2 and DF3 generated through the above-described process may correspond to the outer dummy fin designs.

Figure 12:
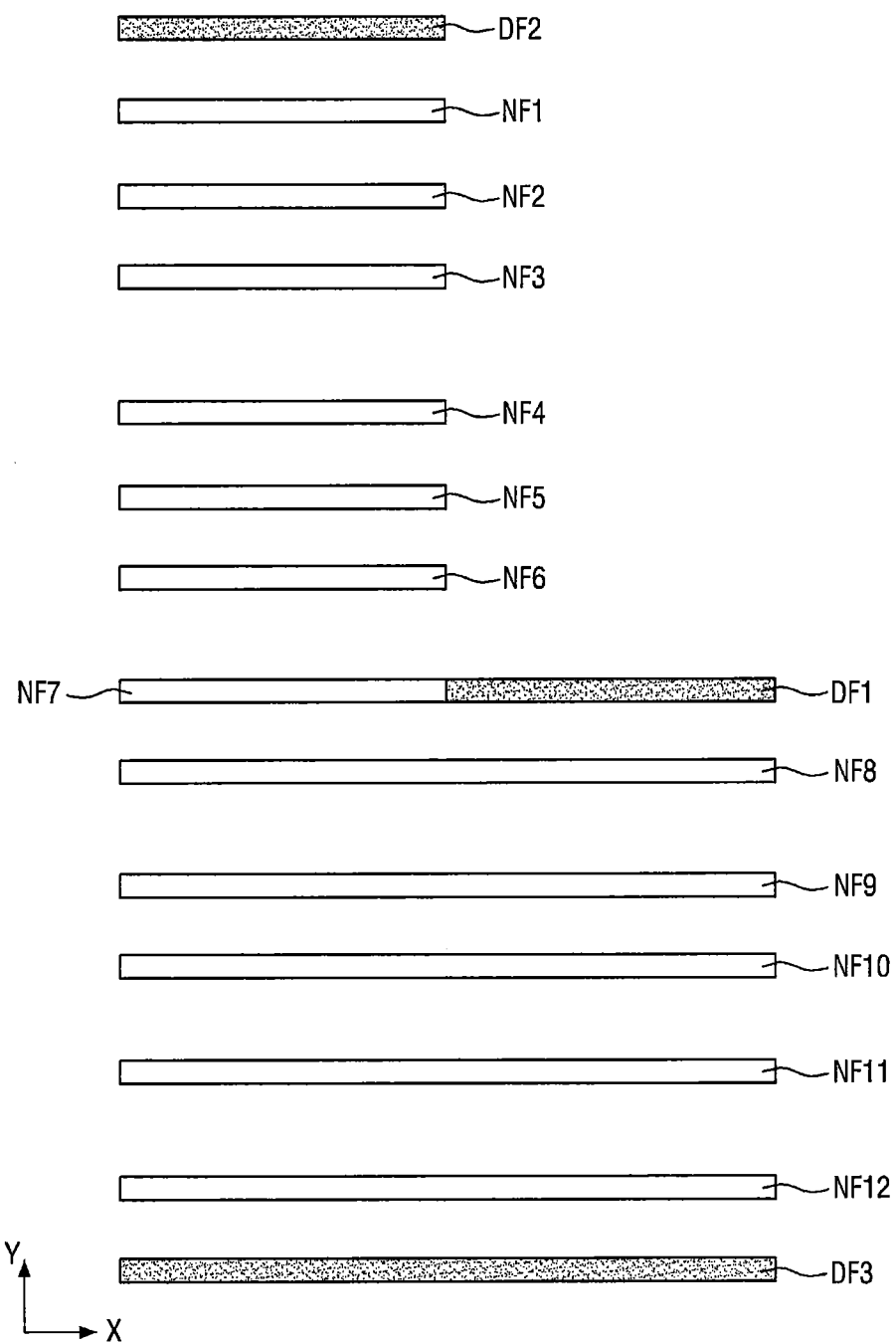

Referring to FIG. 12, the first to third dummy fin designs DF1 to DF3 may be used to appropriately generate the mandrel designs between the given normal fin designs NF1 to NF12.

Figure 13:
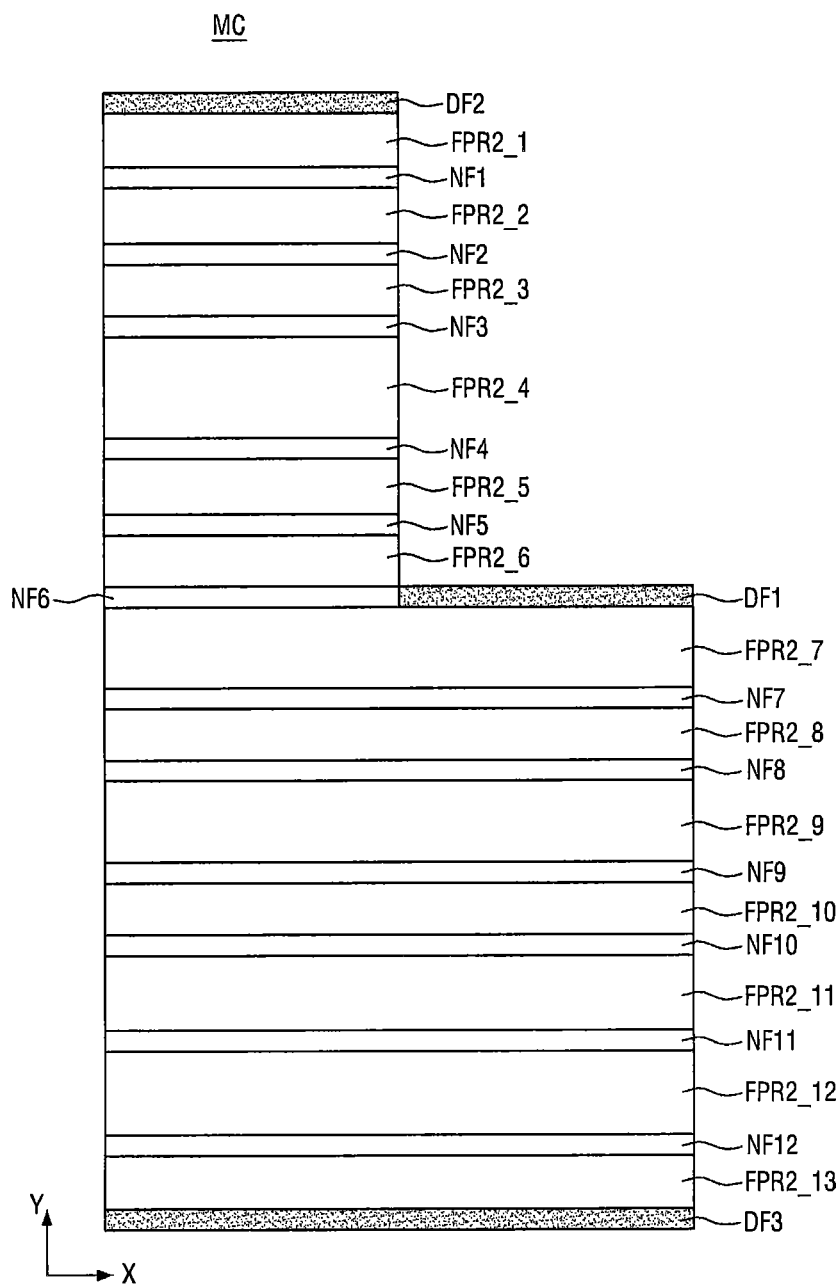

Referring to FIGS. 1 and 13, a mandrel candidate design MC may be generated (S200).

Specifically, the generating the mandrel candidate design MC may include adding the dummy fin designs DF1 to DF3 generated through the above-described process to the plurality of normal fin designs NF1 to NF12, and generating second fin interval region designs FPR2_1 to FPR2_13.

For example, the first to third dummy fin designs DF1 to DF3 may be added to the plurality of normal fin designs NF1 to NF12. Further, the second fin interval region designs FPR2_1 to FPR2_13 may be generated, which may define the intervals between the dummy fin designs and the normal fin designs (e.g., between the second dummy fin design DF2 and the first normal fin design NF1, between the first dummy fin design DF1 and the seventh normal fin design NF7, and between the third dummy fin design DF3 and the 12$^{th}$ normal fin design NF12) in the second direction Y, and the intervals between the plurality of normal fin designs (e.g., between the first and second normal fin designs NF1 and NF2) in the second direction Y.

Next, referring to FIGS. 1, 14, and 15, a first mandrel mask design MM1 and a second mandrel mask design MM2 may be generated by decomposing the mandrel candidate design MC (S250).

Specifically, some of the second fin interval region designs FPR2_1 to FPR2_13 of the mandrel candidate design MC (in FIG. 13) may be decomposed to a first mandrel mask design MM1, and the remainder thereof may be decomposed to a second mandrel mask design MM2. Further, some of the second fin interval region designs FPR2_1 to FPR2_13 that are decomposed to the first mandrel mask design MM1 may be alternately arranged with the remainder of the second fin interval region designs FPR2_1 to FPR2_13 that are decomposed to the second mandrel mask design MM2. In other words, the first mandrel mask design MM1 and the second mandrel mask design MM2 may include respective alternating ones of the second fin interval region designs FPR2_1 to FPR2_13.

For example, the first mandrel mask design MM1 may include some (e.g., FPR2_2, FPR2_4, FPR2_6, FPR2_8, FPR2_10, and FPR2_12) of the second fin interval region designs FPR2_1 to FPR2_13. In contrast, the second mandrel mask design MM2 may include the remainder (e.g., FPR2_1, FPR2_5, FPR2_7, FPR2_9, FPR2_11, and FPR2_13) of the second fin interval region designs FPR2_1 to FPR2_13.

Next, referring to FIGS. 1 and 16 to 21, a final mandrel design FM (in FIG. 21) may be generated.

Specifically, the final mandrel design FM (in FIG. 21) may be generated using one of the first and second mandrel mask designs MM1 and MM2 that satisfies a predetermined condition. The generation of the final mandrel design FM (in FIG. 21) may be performed through various processes, which will be described below.

Figure 16:
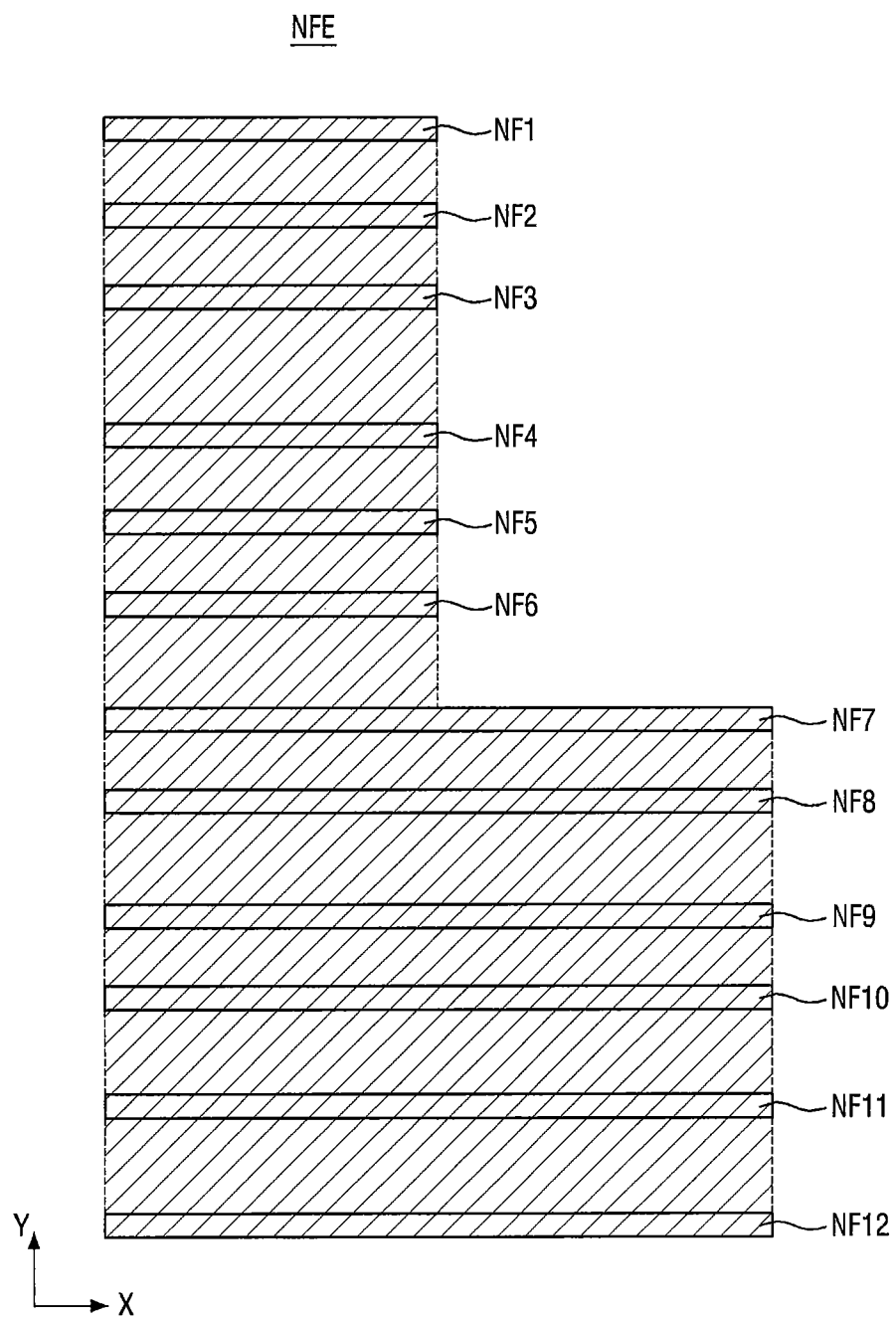

First, referring to FIG. 16, a normal fin enclosure design NFE may be generated including the plurality of normal fin designs NF1 to NF12 generated as shown in FIG. 2.

Specifically, the normal fin enclosure design NFE corresponds to selection of a region that includes all the plurality of normal fin designs NF1 to NF12. For example, the normal fin enclosure design NFE may correspond to selection of all regions between the first normal fin design NF1 and the 12$^{th}$ normal fin design NF12.

Figure 17:
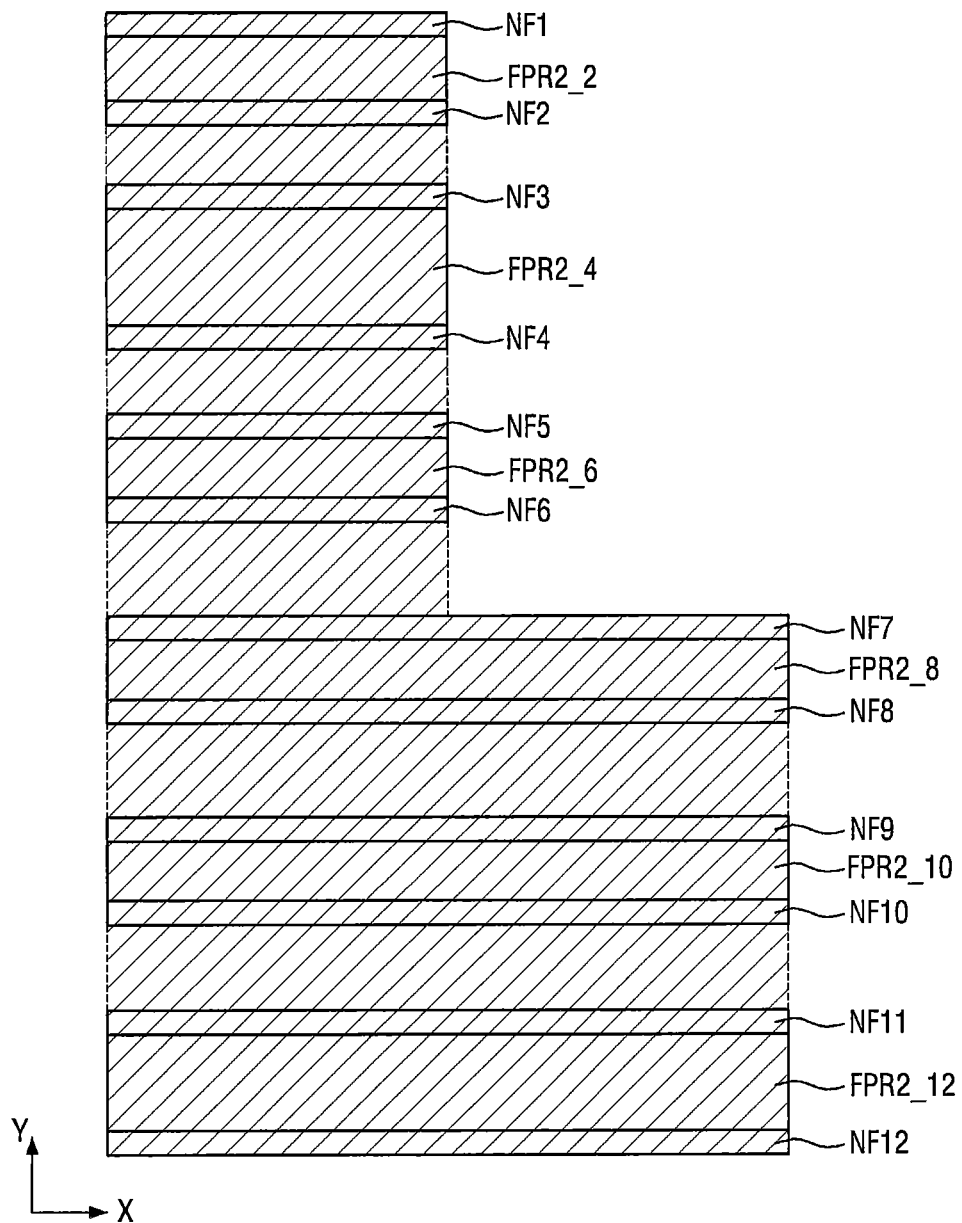
Figure 18:
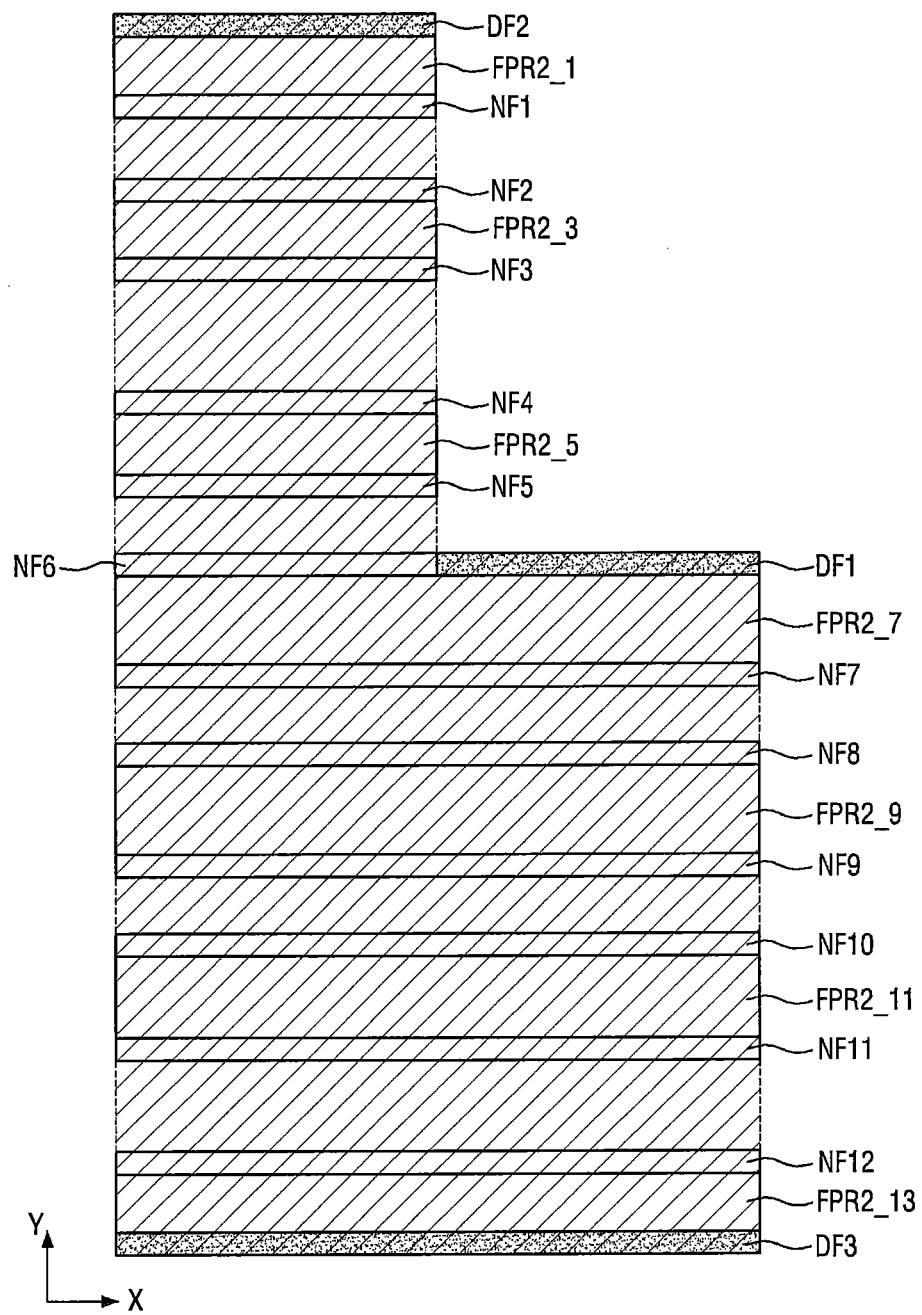

Next, referring to FIGS. 17 and 18, first and second mandrel mask enclosure designs MME1 and MME2 may be generated on the basis of the first and second mandrel mask designs MM2 decomposed as shown in FIGS. 14 and 15.

Specifically, the first mandrel mask enclosure design MME1 of FIG. 17 corresponds to selection of all regions between the first normal fin design NF1 and the 12$^{th}$ normal fin design NF12 of the first mandrel mask design MM1. Further, the second mandrel mask enclosure design MME2 of FIG. 18 corresponds to selection of all regions between the second dummy fin design DF2 and the third dummy fin design DF3 of the second mandrel mask design MM2.

The first and second mandrel mask enclosure designs MME1 and MME2 generated through the above-described process may be compared with the respective normal fin enclosure design NFE. Specifically, for example, the first and second mandrel mask enclosure designs MME1 and MME2 may be compared with the respective normal fin enclosure design NFE through an XOR operation. The result of the XOR operation will be described with reference to FIGS. 19 and 20.

Referring to FIG. 19, the result of an XOR operation MM1_XOR between the first mandrel mask enclosure design MME1 and the normal fin enclosure design NFE is illustrated.

The selected region of the first mandrel mask enclosure design MME1 may be the same as the selected region of the normal fin enclosure design NFE. That is, the selected regions may be the same between the first normal fin design NF1 and the 12$^{th}$ normal fin design NF12. Accordingly, the dummy fin designs that are not directly drawn by a designer may not be included in the result of the XOR operation MM1_XOR between the first mandrel mask enclosure design MME1 and the normal fin enclosure design NFE.

Figure 20:
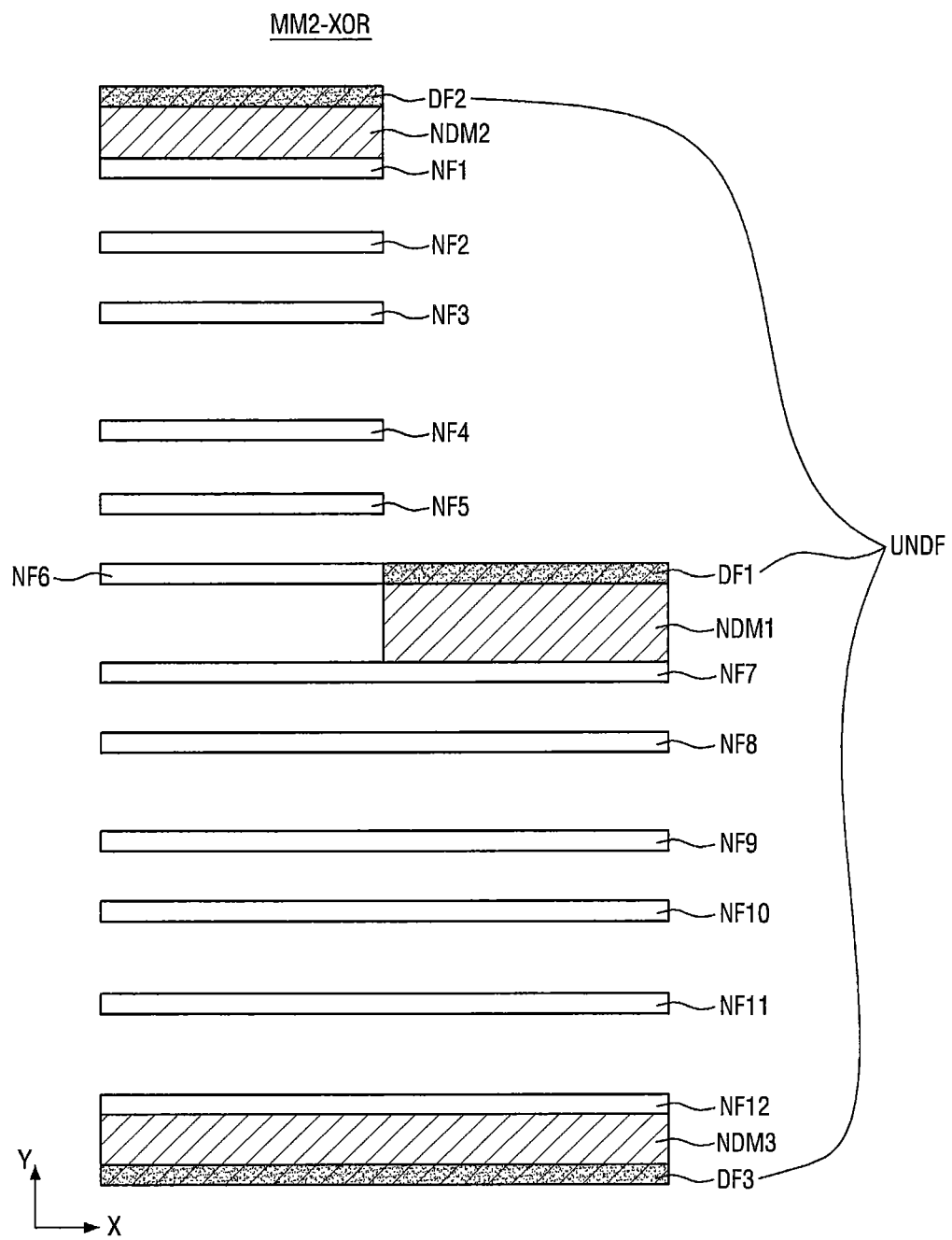

Referring to FIG. 20, the result of an XOR operation MM2_XOR between the second mandrel mask enclosure design MME2 and the normal fin enclosure design NFE is illustrated.

The selected region of the second mandrel mask enclosure design MME2 may be wider than the selected region of the normal fin enclosure design NFE. That is, the selected region of the second mandrel mask enclosure design MME2 may be a region between the second dummy fin design DF2 and the third dummy fin design DF3, and may be wider than the selected region of the normal fin enclosure design NFE. Accordingly, the result of the XOR operation MM2_XOR between the second mandrel mask enclosure design MME2 and the normal fin enclosure design NFE may include the dummy fin designs UNDF that are not directly drawn by the designer, i.e., the first to third dummy fin designs DF1 to DF3.

As a result, the first mandrel mask design MM1 may satisfy the predetermined condition (e.g., whether to include the dummy fin design UNDF that is not directly drawn by the designer), and thus can be selected as the final mandrel mask design.

Figure 21:
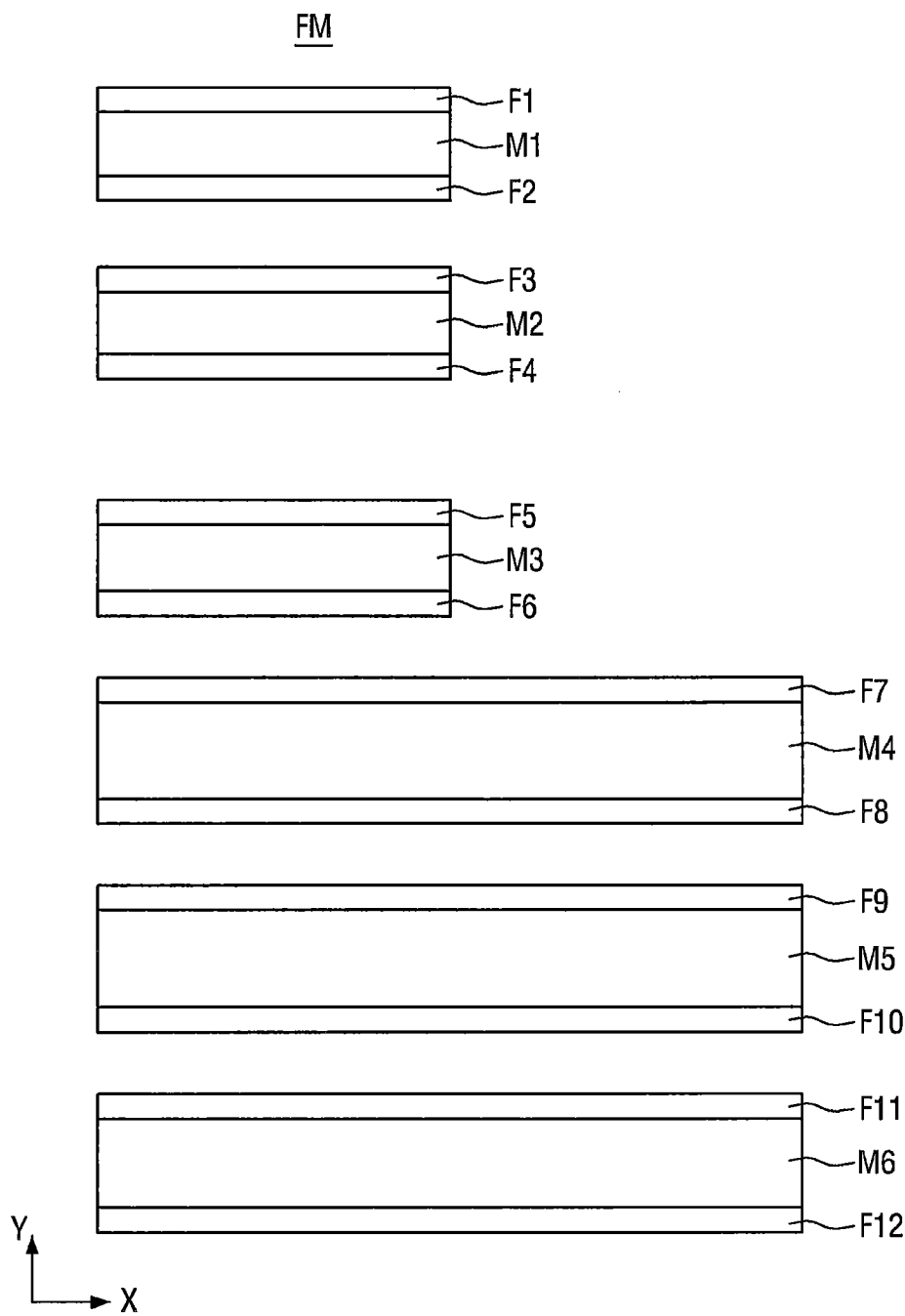

Last, referring to FIGS. 1 and 21, a final mandrel mask design may be generated (S300).

Specifically, final mandrel mask design FM, including final mandrel designs M1 to M6 and final fin designs F1 to F12, may be generated using the first mandrel mask design MM1 finally selected.

Accordingly, the final mandrel designs M1 to M6 that are generated on the basis of the first mandrel mask design MM1 may be generated between the final fin designs F1 to F12. Further, the widths of the final mandrel designs M1 to M6 in the second direction Y may be variously designed to correspond to the intervals between the final fin designs F1 to F12 in the second direction Y. That is, some of the final mandrel designs M1 to M6 may have the same width in the second direction Y, and the remainder thereof may have different widths.

In addition, after generation of the final fin designs F1 to F12 and the final mandrel designs M1 to M6, it may be checked whether misalignment occurs between the final mandrel mask design and the normal fin design (e.g., between the first final mandrel design M1 and the second final fin F2), or between the final mandrel design and the dummy fin design (e.g., between the first final mandrel design M1 and the first final fin F1) (S350).

That is, according to the layout design method according to some embodiments of the present inventive concepts, if the normal fin designs NF1 to NF12 that are spaced apart from each other at various intervals in the second direction Y are given, the dummy fin designs DF1 to DF3 can be automatically generated in consideration of the intervals between the normal fin designs NF1 to NF12 in the second direction Y. Further, the final mandrel designs M1 to M6 having various widths in the second direction Y to correspond to the various intervals in the second direction Y can be automatically generated. In addition, according to the layout design method of the present inventive concepts, product reliability can be guaranteed through checking whether misalignment finally occurs.

The layout design method according to some embodiment of the present inventive concepts as described above can be implemented as a computer-readable code or program recorded on a computer-readable recording medium. The computer-readable recording medium may include all kinds of recording devices in which data that can be read by a computer system is stored. That is, the computer-readable recording medium may include a program command, a data file, and a data structure solely or in a combination. The program command that is recorded in the recording medium may be specially designed and configured for the present inventive concepts, or may be known to and used by a computer software provider. Examples of computer-readable recording media may include a ROM, a RAM, a CD-ROM, a magnetic tape, a floppy disc, and an optical data storage device, and may be implemented in the form of carrier waves (for example, transmission through the Internet). Further, in the computer-readable recording medium which is distributed in a computer system connected through a network, codes that can be read by a computer in a distribution method may be stored and executed.

Hereinafter, referring to FIGS. 22 and 23, a layout design system that performs the layout design method of FIG. 1 will be described. Explanation of the duplicate contents to the above-described contents will be omitted.

Further, the term "unit" or "module", as used herein, means, but is not limited to, a software or hardware component, such as a FPGA or ASIC, which performs certain tasks. A unit or module may advantageously be configured to reside on the addressable storage medium and configured to execute on one or more processors. Accordingly, a unit or module may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. The functionality provided for in the components and units or modules may be combined into fewer components and units or modules or further separated into additional components and units or modules.

Figure 22:
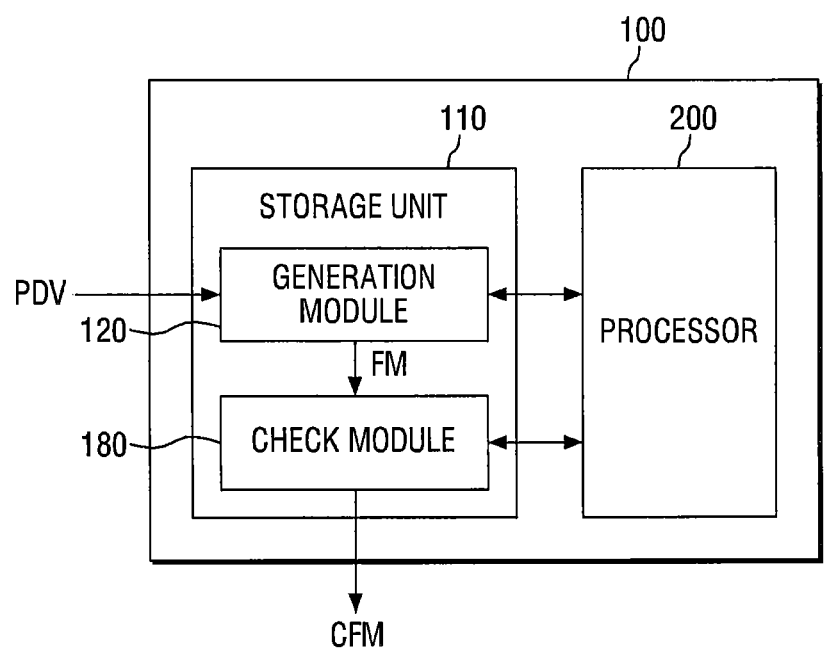
FIG. 22 is a schematic block diagram illustrating layout design systems that may perform the layout design methods of FIG. 1, according to some embodiments of the present inventive concepts.
Figure 23:
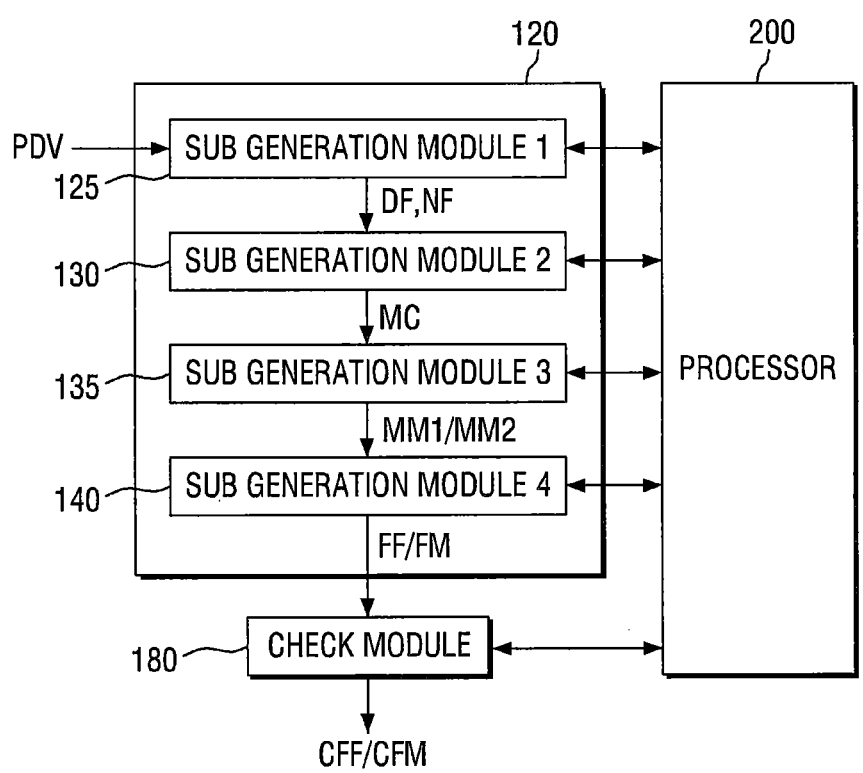
FIG. 23 is a schematic block diagram illustrating a generation module of the layout design systems of FIG. 22, according to some embodiments of the present inventive concepts.

Referring to FIGS. 22 and 23, a layout design system 100 may include a processor 200 and a storage unit 110. Further, the storage unit 110 may include a generation module 120 and a check module 180.

Specifically, the generation module 120 may receive predetermined values PDV related to normal fin designs and generate a final mandrel mask design FM using the processor 200.

The generation module 120 may include, for example, first to fourth sub generation modules 125, 130, 135, and 140.

The first sub generation module 125 may generate dummy fin designs DF based on the predetermined values PDV. Of course, the first sub generation module 125 may also generate normal fin designs NF based on the predetermined values PDV. Further, the first sub generation module 125 may provide the generated normal fin designs NF and the dummy fin designs DF to the second sub generation module 130.

The second sub generation module 130 may generate mandrel candidate designs MC based on the normal fin designs NF and the dummy fin designs DF.

Specifically, the second sub generation module 130 may receive the normal fin designs NF and the dummy fin designs DF from the first sub generation module 125, and may generate the mandrel candidate designs MC. Further, the second sub generation module 130 may provide the generated mandrel candidate designs MC to the third sub generation module 135.

The third sub generation module 135 may decompose the mandrel candidate designs MC to first and second mandrel mask designs MM1 and MM2.

Specifically, the third sub generation module 135 may receive the mandrel candidate designs MC from the second sub generation module 130, and decompose the mandrel candidate designs MC to the first and second mandrel designs MM2. Further, the third sub generation module 135 may provide the first and second mandrel mask designs MM2 to the fourth sub generation module 140.

The fourth sub generation module 140 may generate a final mandrel mask design FM using one of the first and second mandrel mask designs MM2 that satisfies the predetermined condition.

Specifically, the fourth sub generation module 140 may generate the final mandrel mask design FM using one of the first and second mandrel mask designs MM2 that satisfies the predetermined condition. Further, the fourth sub generation module 140 may provided the final fin design FF that is obtained by adding the dummy fin designs DF to the normal fin design NF and the final mandrel design FM to the check module 180.

The check module 180 may check whether the misalignment occurs between the final mandrel design FM and the final fin design FF using the processor 200.

Specifically, the check module 180 may check whether the misalignment occurs between the final mandrel design FM and the final fin design FF that are provided from the generation module 120, i.e., the fourth sub generation module 140 (e.g., between the final mandrel design FM and the normal fin design NF or between the final mandrel design FM and the dummy fin design DF). Further, the check module 180 may output the final mandrel design and the final fin design CFF/CFM that pass through the checking process.

Although preferred embodiments of the present inventive concepts have been described for illustrative purposes, those skilled in the art will appreciate that various modifications, additions and substitutions are possible, without departing from the scope and spirit of the inventive concepts as disclosed in the accompanying claims.

What is claimed is:

1. A layout design method comprising:
   receiving predetermined values related to first to third normal fin designs extending in a first direction and arranged in parallel in a second direction perpendicular to the first direction;
   generating dummy fin designs based on the predetermined values;
   generating mandrel candidate designs based on the first to third normal fin designs and the dummy fin designs;
   decomposing the mandrel candidate designs to first and second mandrel mask designs; and
   generating a final mandrel mask design using one of the first and second mandrel mask designs that satisfies a predetermined condition,
   wherein a first interval distance in the second direction between the first normal fin design and the second normal fin design is different from a second interval distance in the second direction between the second normal fin design and the third normal fin design.

2. The layout design method of claim 1, wherein the predetermined values related to the first to third normal fin designs comprise values that define widths of the first to third normal fin designs in the second direction and intervals between the first to third normal fin designs in the second direction.

3. The layout design method of claim 2, wherein generating the dummy fin designs based on the predetermined values comprises:
   generating first fin interval region designs that define the intervals between the first to third normal fin designs in the second direction based on the predetermined values;
   generating dummy region designs on side surfaces of the first to third normal fin designs; and
   generating the dummy fin designs based on the dummy region designs.

4. The layout design method of claim 3, wherein the generating the dummy fin designs based on the dummy region designs comprises:
   selecting ones of the dummy region designs that overlap the first fin interval region designs;
   generating a rectangular region design based on the selected ones of the dummy region designs;
   defining a mandrel region design in a portion of the rectangular region design that is free of the first fin interval region designs; and
   generating a dummy fin design on a side surface of the mandrel region design that is not in contact with the dummy region designs.

5. The layout design method of claim 4, wherein the rectangular region design is generated between adjacent first and second ones of the dummy region designs, wherein the first one of the dummy region designs has a longer length in the first direction than a length in the first direction of the second one of the dummy region designs, and wherein the first one of the dummy region designs defines one side of the rectangular region design.

6. The layout design method of claim 3, wherein the generating the dummy fin designs based on the dummy region designs comprises:
   selecting ones of the dummy region designs that do not overlap the first fin interval region designs;
   defining respective mandrel region designs corresponding to the selected ones of the dummy region designs, wherein ones of the mandrel region designs have a side surface defined by a corresponding one of the selected dummy region designs; and
   generating the dummy fin designs on outer side surfaces of the mandrel region designs corresponding to the selected ones of the dummy region designs, wherein the outer side surfaces of the mandrel region designs are opposite the dummy region designs.

7. The layout design method of claim 2, wherein ones of a subset of the first to third normal fin designs have a different length in the first direction than lengths in the first direction of ones of a remaining subset of the first to third normal fin designs.

8. The layout design method of claim 7, wherein widths of the first to third normal fin designs in the second direction are equal to each other.

9. The layout design method of claim 1, wherein generating the mandrel candidate designs comprises:
   generating second fin interval region designs defining respective intervals between ones of the dummy fin designs and adjacent ones of the first to third normal fin designs in the second direction and intervals between adjacent ones of the first to third normal fin designs in the second direction.

10. The layout design method of claim 9, wherein decomposing the mandrel candidate designs to first and second mandrel mask designs comprises generating the first mandrel mask design comprising a subset of the second fin interval region designs, and generating the second mandrel mask design comprising a remaining subset of the second fin interval region designs.

11. The layout design method of claim 1, wherein generating the final mandrel mask design using the one of the first and second mandrel mask designs that satisfies the predetermined condition comprises:
   generating a normal fin enclosure design based on the first to third normal fin designs;
   generating first and second mandrel mask enclosure designs based on the first and second mandrel mask designs;
   selecting one of the first and second mandrel mask designs that satisfies the predetermined condition through comparison of the first and second mandrel mask enclosure designs with the normal fin enclosure design; and
   generating the final mandrel mask design using the selected one of the first and second mandrel mask designs.

12. The layout design method of claim 1, further comprising checking whether misalignment occurs between the final mandrel mask design and ones of the first to third normal fin designs or between the final mandrel mask design and ones of the dummy fin designs.

13. The layout design method of claim 1, wherein the final mandrel mask design comprises a plurality of final mandrel designs, and ones of a subset of the plurality of final mandrel designs have a different width in the second direction than widths in the second direction of ones of a remaining subset of the plurality of final mandrel designs.

14. A layout design system comprising:
a processor; and
a memory coupled to the processor and comprising computer readable code embodied in the memory that when executed by the processor causes the processor to perform operations comprising:
receiving predetermined values related to normal fin designs;
generating dummy fin designs based on the predetermined values;
generating mandrel candidate designs based on the normal fin designs and the dummy fin designs;
decomposing the mandrel candidate designs to first and second mandrel mask designs; and
generating a final mandrel design using one of the first and second mandrel mask designs that satisfies a predetermined condition.

15. The layout design system of claim 14, wherein the operations further comprise checking whether misalignment occurs between the final mandrel design and the normal fin designs or between the final mandrel design and the dummy fin designs using the processor.

16. A layout design method of generating a final mandrel mask, comprising:
providing a normal fin design comprising dimensional values defining at least three normal fin regions extending parallel to each other in a first direction and separated from each other in a second direction perpendicular to the first direction;
generating a dummy fin region extending from a first normal fin region comprising a first length, the dummy fin region extending the first normal fin region to a second length of a second normal fin region adjacent the first normal fin region, the second length longer than the first length;
generating outer mandrel region designs extending in the first direction on outer edges of outer ones of the normal fin regions;
generating dummy fin regions extending in the first direction along outer edges of the outer mandrel region designs;
generating a plurality of candidate mandrel regions extending in the first direction between the normal and dummy fin regions;
generating first and second candidate mandrel mask designs comprising respective alternating ones of the plurality of the candidate mandrel regions and comprising the normal fin regions and/or dummy fin regions contacting the respective alternating ones of the plurality of the candidate mandrel regions;
selecting one of the first and second candidate mandrel mask designs; and
generating the final mandrel mask comprising the mandrel regions of the selected one of the first and second candidate mandrel mask designs.

17. The layout design method of claim 16, further comprising:
generating a final fin design comprising the normal fin regions and the dummy fin regions of the selected one of the first and second mandrel mask designs; and
checking for misalignment between the final mandrel mask and the final fin design.

18. The layout design method of claim 16, wherein selecting between the first and second candidate mandrel mask designs comprises:
comparing the first and second candidate mandrel mask designs to the normal fin design;
determining that a match of the first candidate mandrel mask design to the normal fin design is closer than a match of the second candidate mandrel mask design to the normal fin design based on the comparing the first and second candidate mandrel mask designs to the normal fin design; and
selecting the first candidate mandrel mask design based on the determining that the match of the first candidate mandrel mask design to the normal fin design is closer than the match of the second candidate mandrel mask design to the normal fin design.

19. The layout design method of claim 18, wherein comparing the first and second candidate mandrel mask designs to the normal fin design comprises performing a first XOR operation between the first candidate mandrel mask design and the normal fin design and a second XOR operation between the second candidate mandrel mask design and the normal fin design.

20. The layout design method of claim 16, wherein selecting between the first and second candidate mandrel mask designs comprises:
determining that the first candidate mandrel mask design comprises fewer dummy gate regions than the second candidate mandrel mask design; and
selecting the first candidate mandrel mask design based on the determining that the first candidate mandrel mask design comprises fewer dummy gate regions than the second candidate mandrel mask design.

* * * * *